(12) United States Patent
Fang et al.

(10) Patent No.: US 10,672,696 B2
(45) Date of Patent: Jun. 2, 2020

(54) SEMICONDUCTOR DEVICE PACKAGE

(71) Applicant: Advanced Semiconductor Engineering, Inc., Kaohsiung (TW)

(72) Inventors: Jen-Kuang Fang, Kaohsiung (TW); Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/821,599

(22) Filed: Nov. 22, 2017

(65) Prior Publication Data

US 2019/0157197 A1 May 23, 2019

(51) Int. Cl.
*H01L 23/498* (2006.01)
*H01L 23/00* (2006.01)
(Continued)

(52) U.S. Cl.
CPC .... *H01L 23/49833* (2013.01); *H01L 23/3107* (2013.01); *H01L 23/3128* (2013.01); *H01L 24/16* (2013.01); *H01L 24/48* (2013.01); *H01L 24/49* (2013.01); *H01L 24/73* (2013.01); *H01L 24/85* (2013.01); *H01L 24/92* (2013.01); *H01L 21/565* (2013.01); *H01L 24/13* (2013.01); *H01L 24/78* (2013.01); *H01L 2224/13101* (2013.01); *H01L 2224/16145* (2013.01); *H01L 2224/16227* (2013.01); *H01L 2224/2919* (2013.01); *H01L 2224/45111* (2013.01); *H01L 2224/4809* (2013.01); *H01L 2224/4824* (2013.01); *H01L 2224/48091* (2013.01); *H01L 2224/48145* (2013.01); *H01L 2224/48157* (2013.01); *H01L 2224/48227* (2013.01); *H01L 2224/49052* (2013.01); *H01L 2224/49109* (2013.01); *H01L 2224/73204* (2013.01); *H01L 2224/73265* (2013.01); *H01L 2224/78301* (2013.01); *H01L 2224/81815* (2013.01); *H01L 2224/85181* (2013.01); *H01L 2224/92125* (2013.01); *H01L 2224/92127* (2013.01); *H01L 2924/10253* (2013.01); *H01L 2924/15151* (2013.01);
(Continued)

(58) Field of Classification Search
None
See application file for complete search history.

(56) References Cited

U.S. PATENT DOCUMENTS 4,975,761 A * 12/1990 Chu ............... H01L 23/4334
257/686
5,043,794 A * 8/1991 Tai ..................... H01L 23/13
257/686
(Continued)

FOREIGN PATENT DOCUMENTS

JP 3460533 B2 10/2003

*Primary Examiner* — Lex H Malsawma
(74) *Attorney, Agent, or Firm* — Foley & Lardner LLP

(57) ABSTRACT

A semiconductor device package includes an electronic component, a first substrate, a first bonding wire and a second substrate. The electronic component has a first surface. The first substrate is disposed on the first surface of the electronic component. The first bonding wire electrically connects the first substrate to the electronic component. The second substrate is disposed on the first surface of the electronic component. The second substrate defines an opening accommodating the first substrate and the first bonding wire.

23 Claims, 23 Drawing Sheets

(51) Int. Cl.
    *H01L 23/31* (2006.01)
    *H01L 21/56* (2006.01)
(52) U.S. Cl.
    CPC ............ *H01L 2924/15192* (2013.01); *H01L 2924/181* (2013.01); *H01L 2924/18161* (2013.01)

(56) References Cited

U.S. PATENT DOCUMENTS

| | | | | |
|---|---|---|---|---|
| 5,468,999 | A * | 11/1995 | Lin | H01L 23/24 257/700 |
| 5,508,556 | A * | 4/1996 | Lin | H01L 23/055 257/691 |
| 6,150,724 | A * | 11/2000 | Wenzel | H01L 25/0657 257/724 |
| 7,245,007 | B1 * | 7/2007 | Foster | H01L 23/49527 257/666 |
| 7,262,508 | B2 * | 8/2007 | Kelly | H01L 23/13 257/686 |
| 8,018,037 | B2 * | 9/2011 | Chen | H01L 23/13 257/676 |
| 8,288,847 | B2 * | 10/2012 | Huang | H01L 23/3107 257/675 |
| 8,618,641 | B2 * | 12/2013 | Chan | H01L 24/85 257/676 |
| 2003/0124766 | A1 * | 7/2003 | Kim | H01L 21/565 438/106 |
| 2003/0134451 | A1 * | 7/2003 | Chen | H01L 25/0657 438/109 |
| 2005/0073054 | A1 * | 4/2005 | Kelly | H01L 23/13 257/778 |
| 2011/0175212 | A1 * | 7/2011 | Huang | H01L 23/3107 257/675 |

\* cited by examiner

SEMICONDUCTOR DEVICE PACKAGE

BACKGROUND

1. Technical Field

The present disclosure relates to a semiconductor device package and a method for manufacturing the same.

2. Description of the Related Art

A semiconductor device package may include a substrate, a die and a package body encapsulating the die. The semiconductor device package may include, for example, window ball grid array (or window-BGA) products, in which a window is formed in the substrate to facilitate electrical connections between the die and the substrate. However, a relatively large window may be used for forming electrical connections, which may adversely affect miniaturization of the semiconductor device package.

SUMMARY

In one or more embodiments, a semiconductor device package includes an electronic component, a first substrate, a first bonding wire and a second substrate. The electronic component has a first surface. The first substrate is disposed on the first surface of the electronic component. The first bonding wire electrically connects the first substrate to the electronic component. The second substrate is disposed on the first surface of the electronic component. The second substrate defines an opening accommodating the first substrate and the first bonding wire.

In one or more embodiments, a semiconductor device package includes an electronic component, a first substrate, a first bonding wire and a second substrate. The electronic component includes a first surface. The first substrate is disposed on the first surface of the electronic component. The first bonding wire electrically connects the first substrate to the electronic component. The second substrate is disposed on the first surface of the electronic component. The second substrate surrounds the first substrate and is separated from the first substrate.

In one or more embodiments, a method of manufacturing a semiconductor device package comprises providing an electronic component, a first substrate and a second substrate; disposing the first substrate on the electronic component; bonding a first wire to electrically connect the first substrate to the electronic component; disposing the electronic component on the second substrate; and bonding a second wire to electrically connect the second substrate to the first substrate.

BRIEF DESCRIPTION OF THE DRAWINGS

Common reference numerals are used throughout the drawings and the detailed description to indicate the same or similar elements. Embodiments of the present disclosure will be readily understood from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Figure 1A:
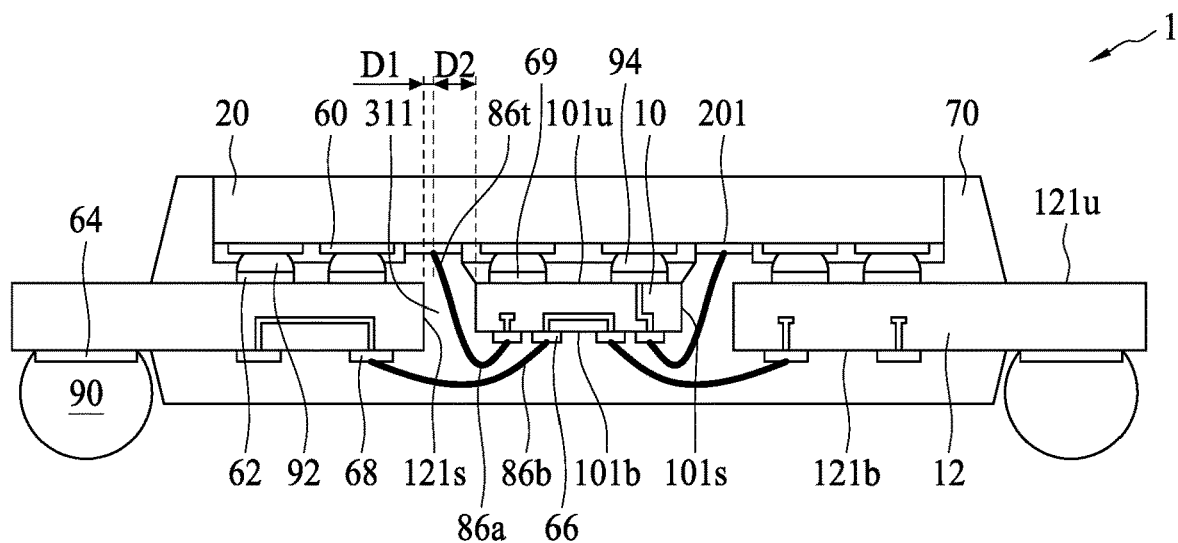
FIG. 1A is a cross-sectional view of a semiconductor device package in accordance with some embodiments of the present disclosure.

FIG. 1A is a cross-sectional view of a semiconductor device package 1 in accordance with some embodiments of the present disclosure. The semiconductor device package 1 includes a substrate 10, a substrate 12, an electronic component 20, electrical contacts 60, 62, 64, 66, 68 and 69, a package body 70, bonding wires 86a and 86b and solder bumps 90, 92 and 94.

The electronic component 20 has a surface 201. In one or more embodiments, the electronic component 20 may be a chip or a die. The substrate 10 has a surface 101u and a surface 101b. The substrate 12 has a surface 121u and a surface 121b. In one or more embodiments, a material of the substrates 10 and 12 may include, for example, bismaleimide triazine (BT), an Ajinomoto build-up film (ABF), polypropylene (PP), a polyimide (PI), an epoxy, or other suitable organic materials. In one or more embodiments, a material of the substrates 10 and 12 may include, for example, silicon (Si), a ceramic, a glass, a metal or other suitable inorganic materials. A thickness of the substrate 10 may be in a range of approximately 50 micrometers (μm) to approximately 200 μm.

The substrate 10 is disposed on the surface 201 of the electronic component 20. The bonding wire 86a connects the substrate 10 to the electronic component 20. The substrate 12 is disposed on the surface 201 of the electronic component 20. The substrate 12 defines an opening 311 accommodating the substrate 10 and the bonding wire 86a. In one or more embodiments, the substrate 10 is inserted into the opening 311 (also referred to herein as a window) defined by the substrate 12. In one or more embodiments, the substrates 10 and 12 may include a redistribution layer (RDL) formed therein. In one or more embodiments, the package body 70 may be a molding compound. One candidate operation to pass the bonding wires 86a through the window/opening 311 is using a nozzle/capillary; therefore, a size/width of the opening 311 may be great enough to accommodate the bonding wires 86a and the nozzle/capillary. A large opening 311 may reduce or sacrifice usable area of the substrate 12 (or a number of inputs/outputs (I/Os) that can be implemented).

The present disclosure provides for substrate structures having relatively smaller opening 311. In one or more examples of the present disclosure, each of a plurality of bonding wires 86a may have a relatively shorter path/length. The relatively shorter path of the bonding wires 86a may minimize or miniaturize the RDL structure formed in the substrate 10. As compared to the RDL structure, the bonding wires 86a, which have a relatively lower impedance, can have relatively better performance for high-speed signal transmission. The cost of forming a relatively larger RDL structure can be thus avoided. A total thickness of the substrates 10 and 12 may be reduced.

In one or more embodiments, a material of the electrical contacts 60, 62, 64, 66, 68 and 69 may include, for example, copper (Cu), another metal or metal alloy, or other suitable conductive materials. In one or more embodiments, the electrical contacts 60, 62, 64, 66, 68 and 69 may be conductive pads. In one or more embodiments, a material of the bonding wires 86a and 86b may include, for example, tin (Sn), another metal or metal alloy, or other suitable conductive materials.

The bonding wire 86a includes a terminal 86t connecting to the electronic component 20. In one or more embodiments, the bonding wire 86a may be connected to the electronic component 20 through the electrical contact 60 and the bonding wire 86a may be connected to the substrate 10 through the electrical contact 66. The substrate 10 has a lateral surface 101s. The substrate 12 has a lateral surface 121s facing the lateral surface 101s of the substrate 10. The substrate 12 is disposed on the surface 201 of the electronic component 20. A distance D1 from the terminal 86t (e.g. from a point at which the terminal 86t contacts the electronic component 20) to the lateral surface 121s of the substrate 12 is smaller than a distance D2 from the terminal 86t to the lateral surface 101s of the substrate 10. In one or more embodiments, the terminal 86t and a portion of the bonding wire 86a are disposed between the electronic component 20 and the substrate 12. A portion of the bonding wire 86a is disposed between the lateral surface 101s of the substrate 10 and lateral surface 121s of the substrate 12. In one or more embodiments, a portion of the bonding wire 86a passes through the substrate 12. The substrate 12 surrounds the substrate 10 and is separated from the substrate 10.

A thickness of the substrate 10 is different from a thickness of the substrate 12. In one or more embodiments, the thickness of the substrate 10 is less than the thickness of the substrate 12 (e.g. is approximately 0.95 or less times the thickness of the substrate 12, is approximately 0.90 or less times the thickness of the substrate 12, or is approximately 0.85 or less times the thickness of the substrate 12). In one or more embodiments, the thickness of the substrate 10 is greater than the thickness of the substrate 12 (e.g. is approximately 1.05 or more times the thickness of the substrate 12, is approximately 1.10 or more times the thickness of the substrate 12, or is approximately 1.15 or more times the thickness of the substrate 12). In one or more embodiments, the lower surface 101b of the substrate 10 and the lower surface 121b of the substrate 12 are not substantially coplanar. A distance between the lower surface 101b of the substrate 10 and the surface 201 of the electronic component 20 is less than a distance between the lower surface 121b of the substrate 12 and the surface 201 of the electronic component 20 (e.g. is approximately 0.95 or less times the distance between the lower surface 121b of the substrate 12 and the surface 201 of the electronic component 20, approximately 0.90 or less times the distance between the lower surface 121b of the substrate 12 and the surface 201 of the electronic component 20, or approximately 0.85 or less times the distance between the lower surface 121b of the substrate 12 and the surface 201 of the electronic component 20).

The electrical contact 68 is disposed on the surface 121b of the substrate 12. The bonding wire 86b electrically connects the substrate 10 to the substrate 12. In one or more embodiments, the bonding wire 86b may be connected to the substrate 10 through the electrical contact 66 and the bonding wire 86b may be connected to the substrate 12 through the electrical contact 68. The lower surface 121b of the substrate 12 is connected to the bonding wire 86b. The package body 70 encapsulates the substrate 10, the substrate 12, the electronic component 20, the bonding wire 86a and the bonding wire 86b.

Figure 1B:
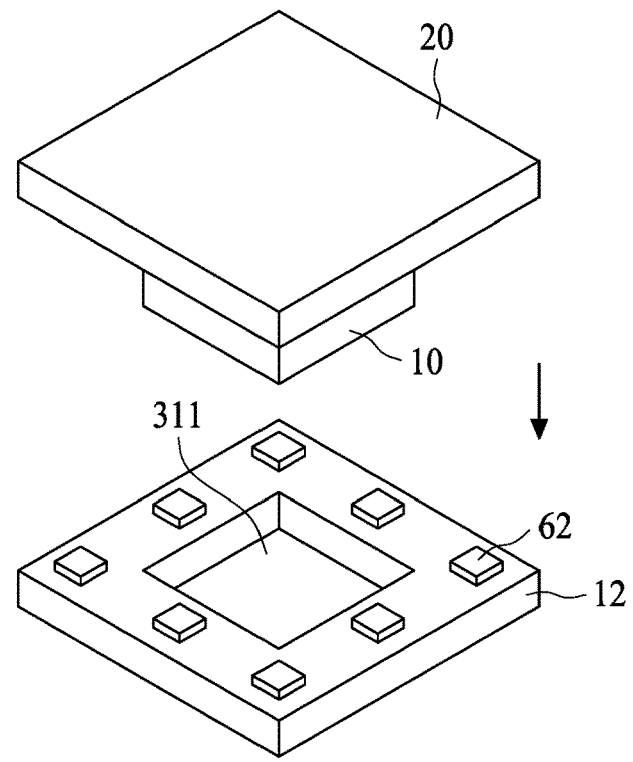
FIG. 1B is a schematic perspective view of a semiconductor device package in accordance with some embodiments of the present disclosure.

FIG. 1B is a schematic perspective view of a semiconductor device package 1 in accordance with some embodiments of the present disclosure. In FIG. 1B, the semiconductor device package 1 includes substrates 10 and 12, an electronic component 20 and electrical contacts 62. The other elements (such as the electrical contacts 60, 64, 66 and 68, the package body 70, the bonding wires 86a and 86b and the solder bumps 90, 92 and 94) are not shown. The substrate 10 is attached to the electronic component 20. The bonding wires 86a are then formed on the substrate 10 and the electronic component 20. Next, the electronic component 20 attached to the substrate 10 is accommodated into the opening 311 of the substrate 12.

Figure 2:
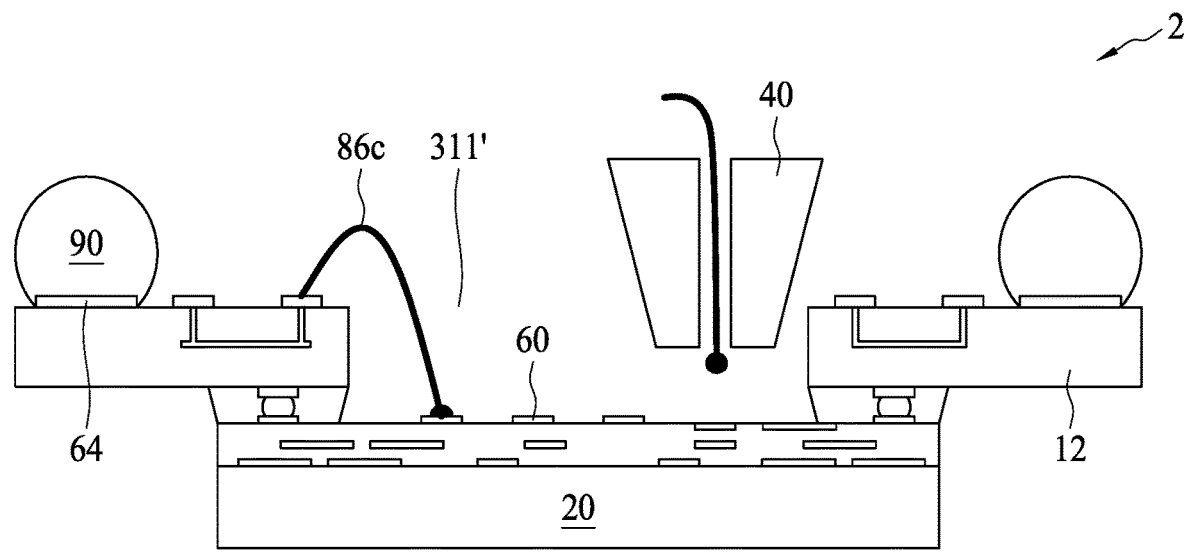
FIG. 2 illustrates an operation for manufacturing bonding wires of the semiconductor device package in accordance with some embodiments of the present disclosure.

FIG. 2 illustrates an operation for manufacturing bonding wires 86c of a semiconductor device package 2 in accordance with some embodiments. The semiconductor device package 2 includes a substrate 12, an electronic component 20, electrical contacts 60 and 64, bonding wires 86c and solder bumps 90. The substrate 12 is attached to the electronic component 20. During the operation for disposing the bonding wires 86c, the semiconductor device package 2 does not include the substrate 10, since the operation for disposing the bonding wires 86c may benefit from a greater operation space to use a nozzle/capillary 40 to form the bonding wires 86c. An opening 311' defined by the substrate 12 may be great enough to accommodate the bonding wires 86c and the nozzle/capillary 40. As compared to the semiconductor device package 1, there is no substrate 10 in the opening 311' after disposing the bonding wires 86c. A number of RDLs having a contact on the active surface of the electronic component 20 can be matched with a number of I/Os of the substrate 12. The area of the opening 311' may not accommodate the structure of the substrate 10, and a number of the RDLs having a contact on the active surface of the electronic component 20 may be correspondingly increased to account for omission of the substrate 10.

Figure 3A:
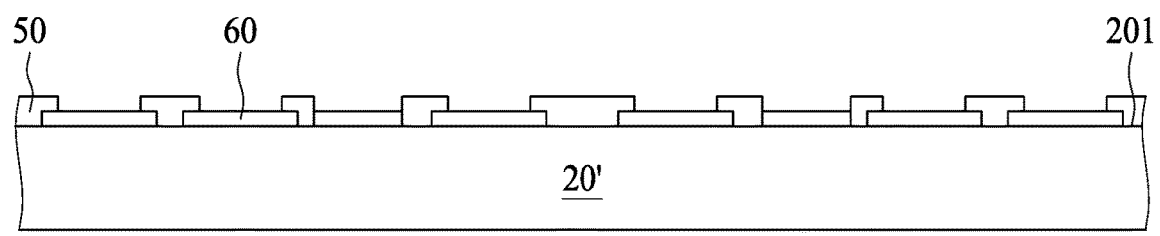
FIG. 3A, FIG. 3B, FIG. 3C, FIG. 3D, FIG. 3E, FIG. 3F, FIG. 3G, FIG. 3H, FIG. 3I, FIG. 3J, FIG. 3K, and FIG. 3L illustrate a method for manufacturing a portion of the semiconductor device package as shown in FIG. 1A in accordance with some embodiments of the present disclosure.

FIG. 3A through FIG. 3L illustrate a method for manufacturing a portion 1a of the semiconductor device package 1 as shown in FIG. 1A in accordance with some embodiments. Referring to FIG. 3A, a wafer 20' including a plurality of electronic components 20 is provided. Electrical contacts 60 are formed on a top surface 201 of the wafer 20'. In one or more embodiments, a material of the electrical contacts 60 may include, for example, Cu, another metal or metal alloy, or other suitable conductive materials. A protection layer 50 is formed on the surface 201 of the wafer 20' and covers a portion of the electrical contacts 60.

Figure 3B:
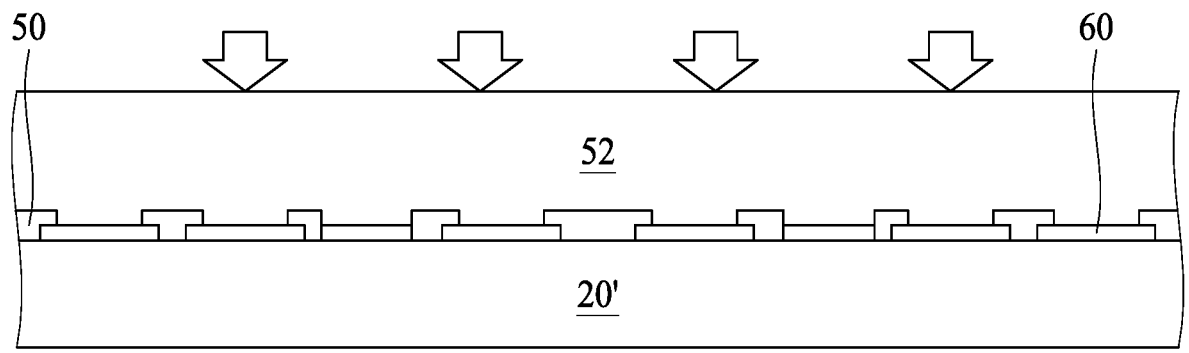

Referring to FIG. 3B, a photoresist layer 52 is formed by coating. The photoresist layer 52 is formed to cover the electrical contacts 60 and the protection layer 50. In one or more embodiments, a material of the photoresist layer 52 may include, for example, a photosensitive material, a positive polyimide, a positive photoresist or other suitable materials.

Figure 3C:
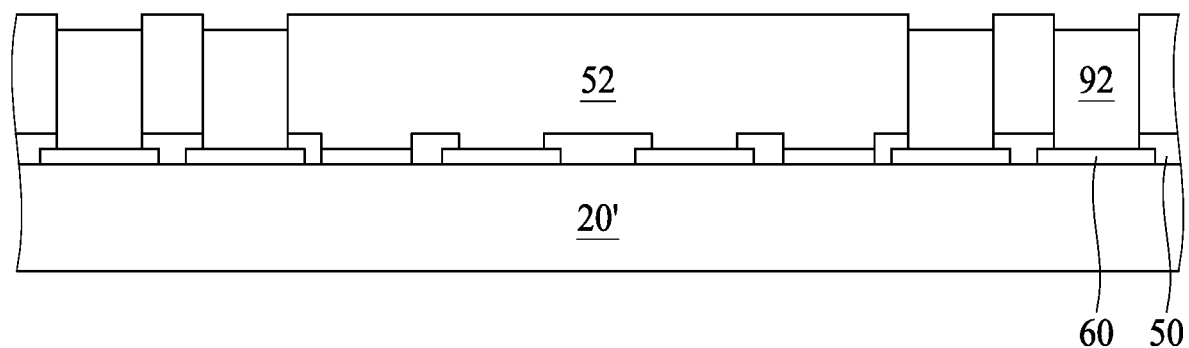

Referring to FIG. 3C, a patterned solder layer 92 is formed into the photoresist layer 52 by using a photolithography etching operation. The patterned solder layer 92 is formed on some of the electrical contacts 60 by solder plating. In one or more embodiments, some of the electrical contacts 60 do not contact the patterned solder layer 92 and are covered by the photoresist layer 52.

Figure 3D:
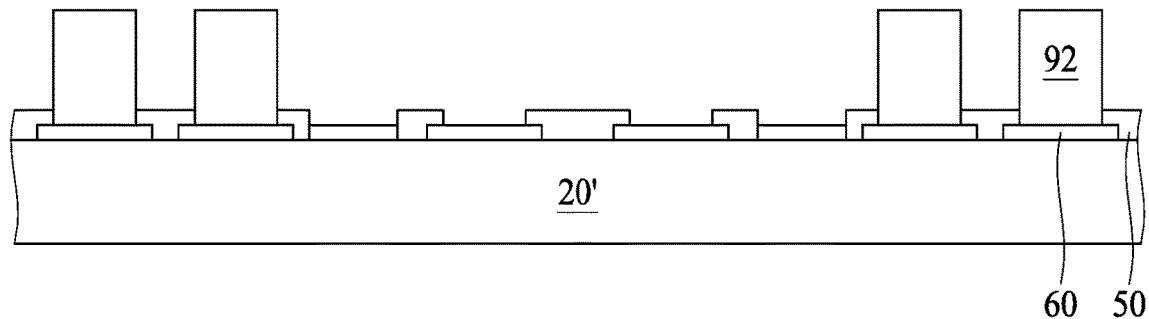

Referring to FIG. 3D, the photoresist layer 52 is removed. After the removing operation of the photoresist layer 52, the patterned solder layer 92 is exposed from the protection layer 50. Some of the electrical contacts 60 are exposed from the protection layer 50 after removing operation.

Figure 3E:
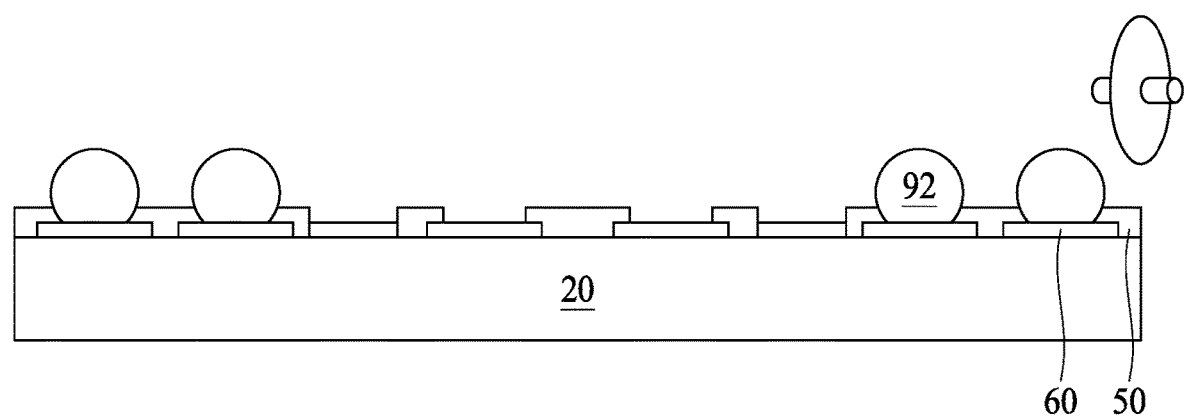

Referring to FIG. 3E, the patterned solder layer 92 is reflowed to form solder bumps. The wafer 20' is then singulated. After the singulation operation, an electronic component 20 is obtained.

Figure 3F:
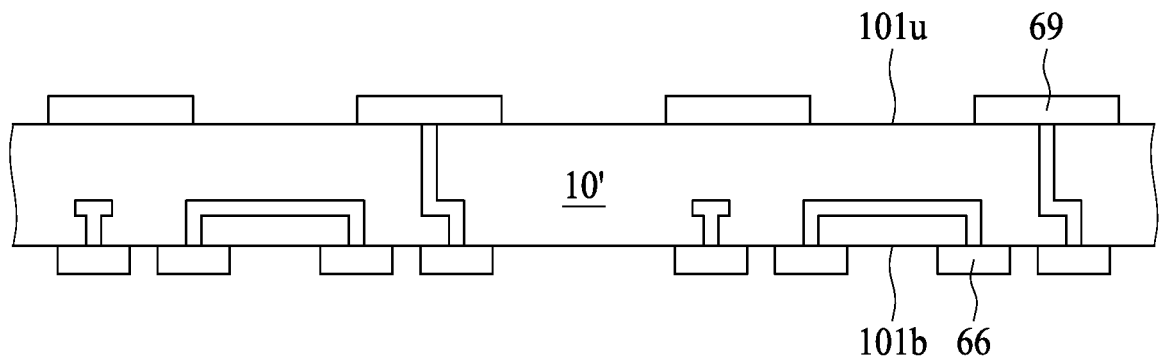

Referring to FIG. 3F, a substrate body 10' having an RDL formed therein is provided. The substrate body 10' has a surface 101u and a surface 101b. In one or more embodiments, a material of the substrate body 10' may include, for example, BT, an ABF, a PP, a PI, an epoxy, or other suitable organic materials. In one or more embodiments, a material of the substrate body 10' may include, for example, Si, a ceramic, a glass, a metal or other suitable inorganic materials. Electrical contacts 69 are formed on the surface 101u. Electrical contacts 66 are formed on the surface 101b. In one or more embodiments, a material of the electrical contacts 66 and 69 may include, for example, Cu, another metal or metal alloy, or other suitable conductive materials.

Figure 3G:
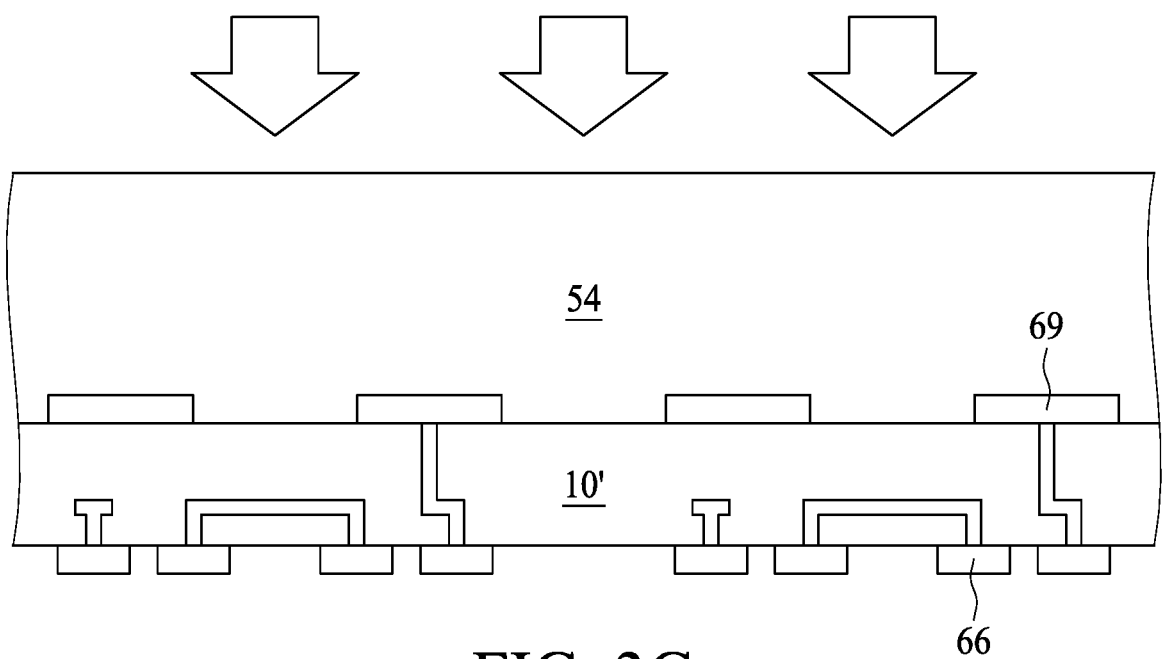

Referring to FIG. 3G, a photoresist layer 54 is formed by coating. The photoresist layer 54 is formed to cover the electrical contacts 69 and the substrate body 10'. In one or more embodiments, the material of the photoresist layer 54 may include, for example, a photosensitive material, a positive polyimide, a positive photoresist or other suitable materials.

Figure 3H:
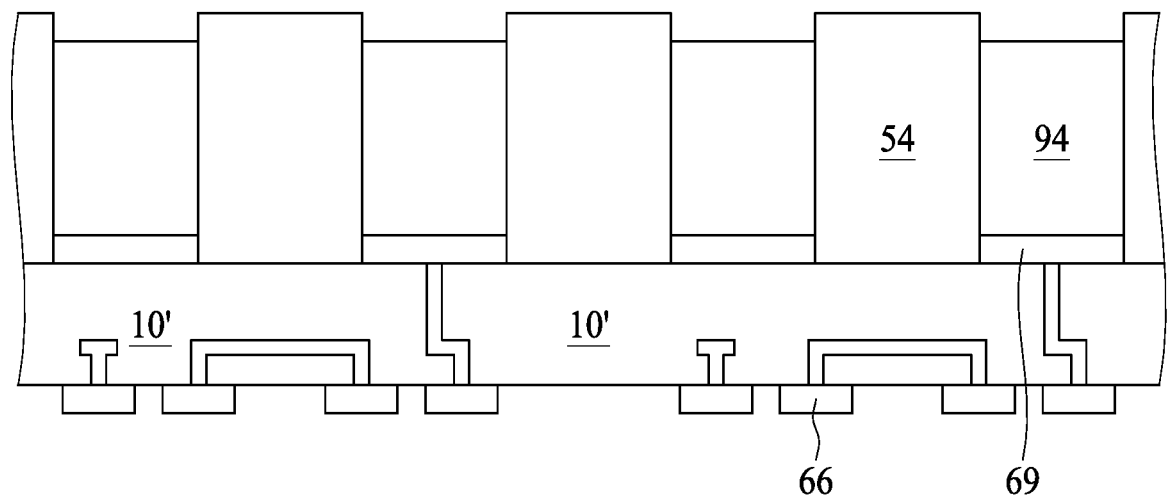

Referring to FIG. 3H, a patterned solder layer 94 is formed into the photoresist layer 54 by using a photolithography etching operation. The patterned solder layer 94 is formed on the electrical contacts 69 by solder plating.

Figure 3I:
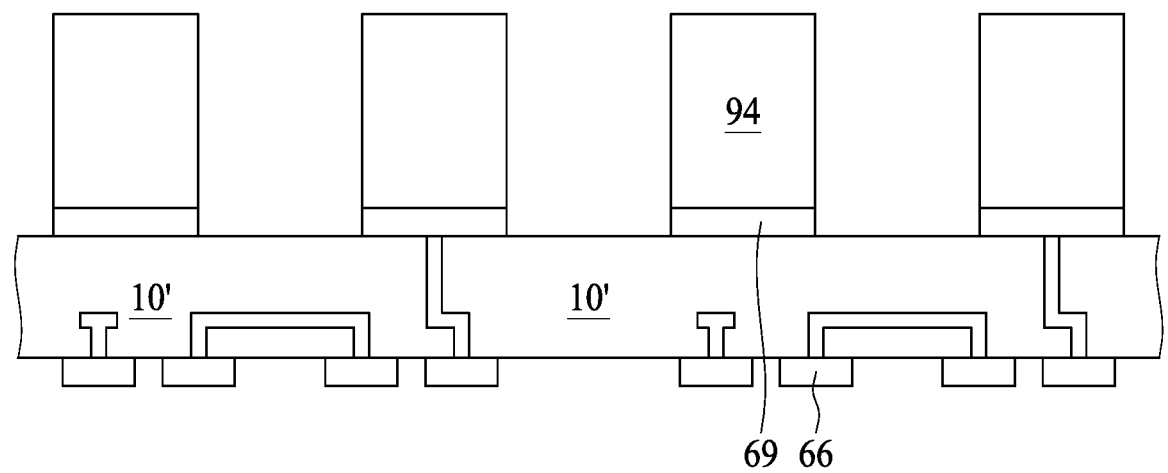

Referring to FIG. 3I, the photoresist layer 54 is removed. After the removing operation of the photoresist layer 54, the patterned solder layer 94 is exposed.

Figure 3J:
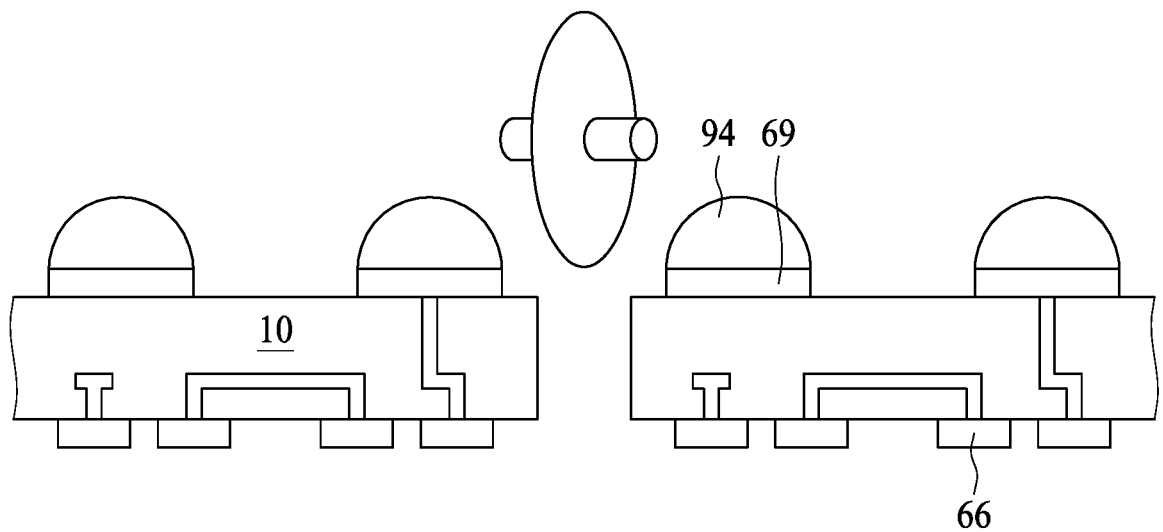

Referring to FIG. 3J, the patterned solder layer 94 is reflowed to form solder bumps. The substrate body 10' is then singulated. After the singulation operation, a substrate 10 is obtained.

Figure 3K:
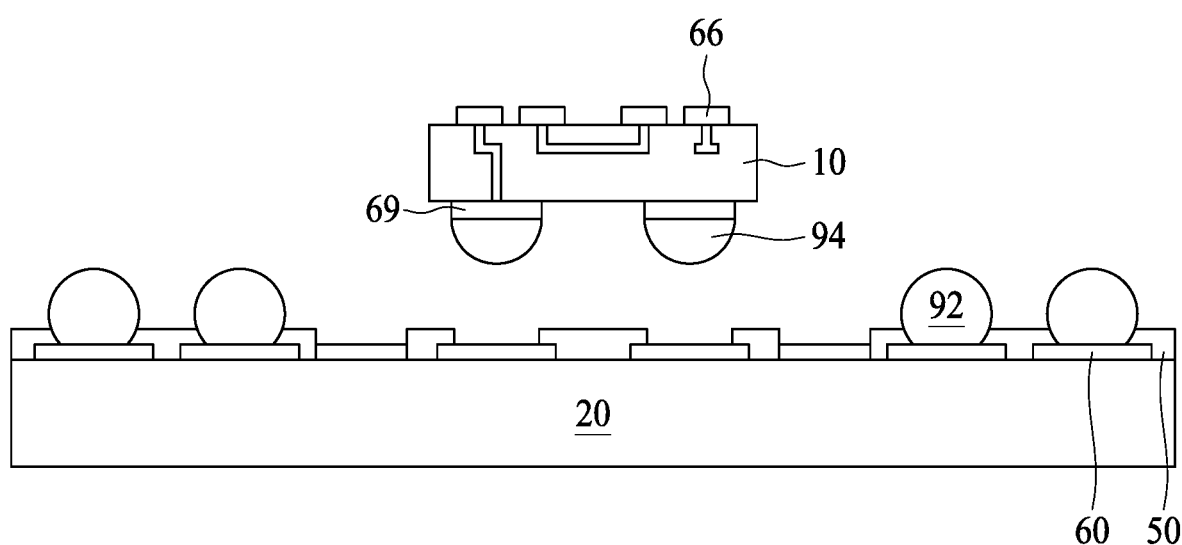

Referring to FIG. 3K, the substrate 10 is attached to the electronic component 20. The solder bumps 94 are electrically connected to the exposed electrical contacts 60. In one or more embodiments, the substrate 10 is attached to the electronic component 20 through an adhesive layer (such as an epoxy) by using a capillary underfill (CUF) operation. In one or more embodiments, the substrate 10 is attached to the electronic component 20 through the connection of the solders 94 and the exposed electrical contacts 60 without an adhesive layer.

Figure 3L:
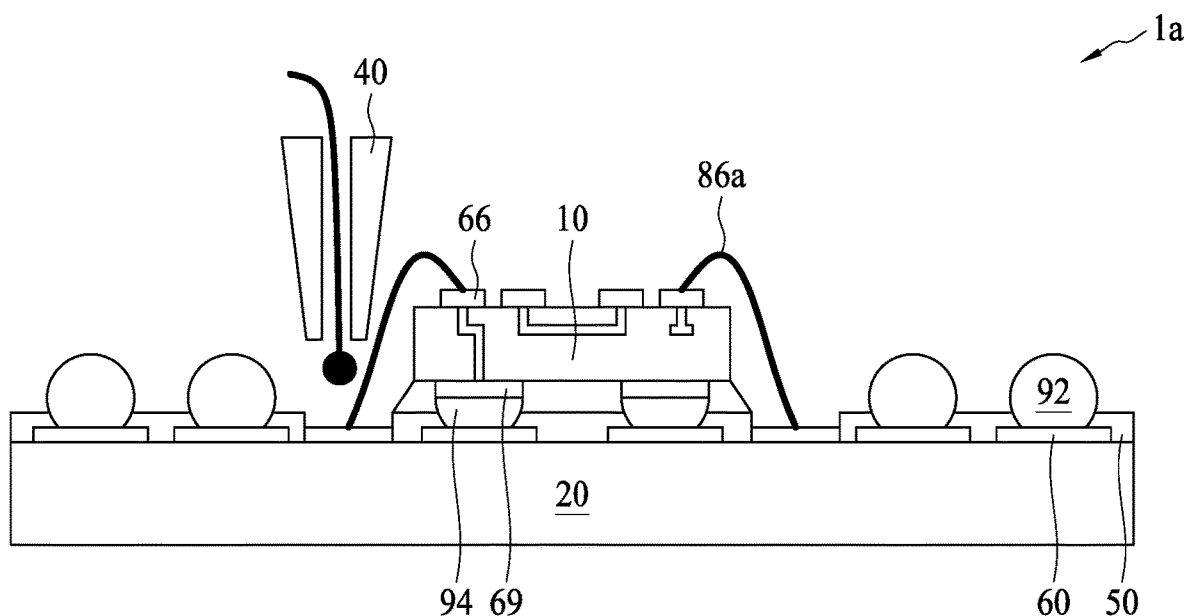

Referring to FIG. 3L, a bonding wire 86a is formed to connect the electronic component 20 and the substrate 10. The bonding wire 86a connects an electrical contact 60 and an electrical contact 66. The bonding wire 86a may be formed by using a nozzle/capillary 40. The bonding wire 86a may be connected to the substrate 10 through the electrical contact 66. In one or more embodiments, a material of the bonding wires 86a may include, for example, Sn, another metal or metal alloy, or other suitable conductive materials. After the disposing of the bonding wire 86a, the portion 1a of the semiconductor device package 1 is obtained.

Figure 4A:
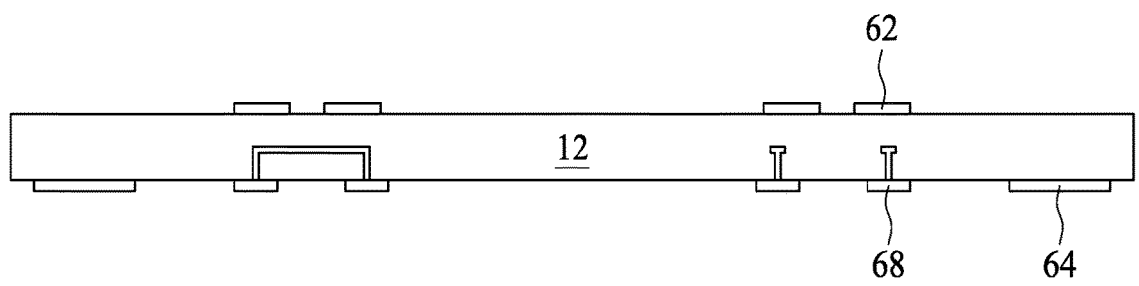
FIG. 4A and FIG. 4B illustrate a method for manufacturing a portion of the semiconductor device package as shown in FIG. 1A in accordance with some embodiments of the present disclosure.
Figure 4B:
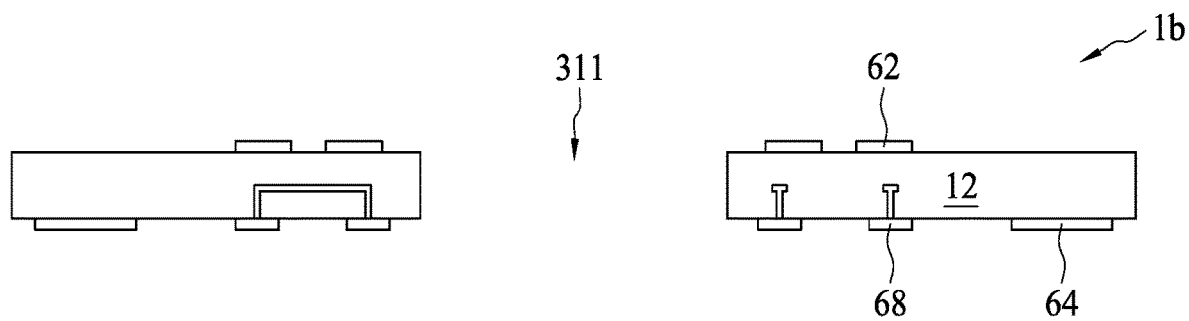

FIG. 4A and FIG. 4B illustrate a method for manufacturing a portion 1b of the semiconductor device package 1 as shown in FIG. 1A in accordance with some embodiments. Referring to FIG. 4A, a substrate 12 including a plurality of electrical contacts 62, 64 and 68 is provided. In one or more embodiments, a material of the electrical contacts 62, 64 and 68 may include, for example, Cu, another metal or metal alloy, or other suitable conductive materials. In one or more embodiments, a material of the substrate 12 may include, for example, BT, an ABF, a PP, a PI, an epoxy, or other suitable organic materials. In one or more embodiments, a material of the substrate 12 may include, for example, Si, a ceramic, a glass, a metal or other suitable inorganic materials.

Referring to FIG. 4B, an opening 311 is formed within the substrate 12. The opening 311 passes through the substrate 12. From a top view, the shape of the opening 311 may be substantially a square shape, a rectangle shape, a round shape or another suitable shape. After forming the opening 311, the portion 1b of the semiconductor device package 1 is obtained.

Figure 5A:
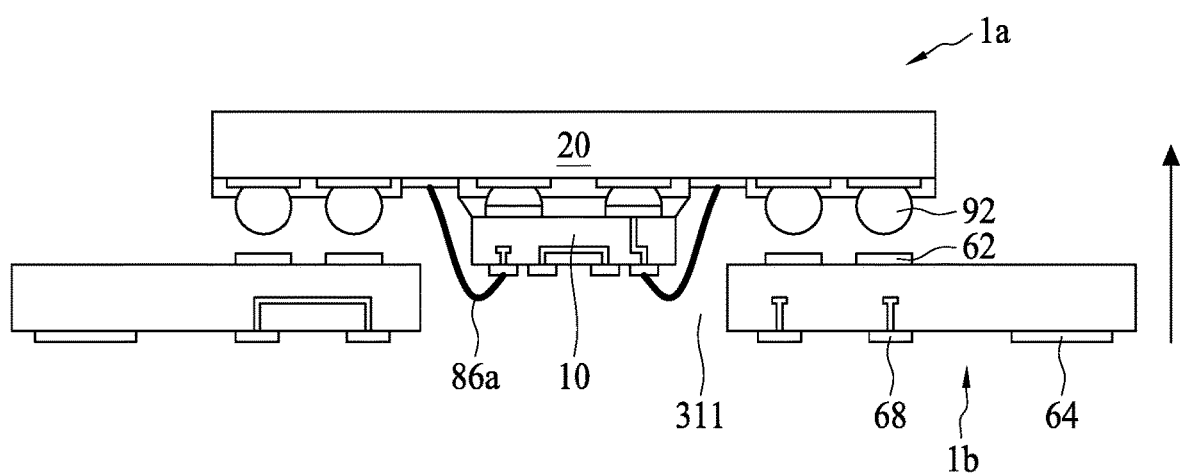
FIG. 5A, FIG. 5B, FIG. 5C, and FIG. 5D illustrate a method for manufacturing the semiconductor device package as shown in FIG. 1A in accordance with some embodiments of the present disclosure.

FIG. 5A through FIG. 5D illustrate a method for manufacturing the semiconductor device package 1 as shown in FIG. 1A in accordance with some embodiments. Referring to FIG. 5A, a portion 1a of a semiconductor device package 1 is inserted into the opening 311 of a portion 1b of the semiconductor device package 1. The inserting operation can include covering a portion of the bonding wire 86a so that the portion of the bonding wire 86a is sandwiched between the electronic component 20 and the substrate 12 (e.g. resulting in a semiconductor device package such as the one shown in FIG. 20).

Figure 5B:
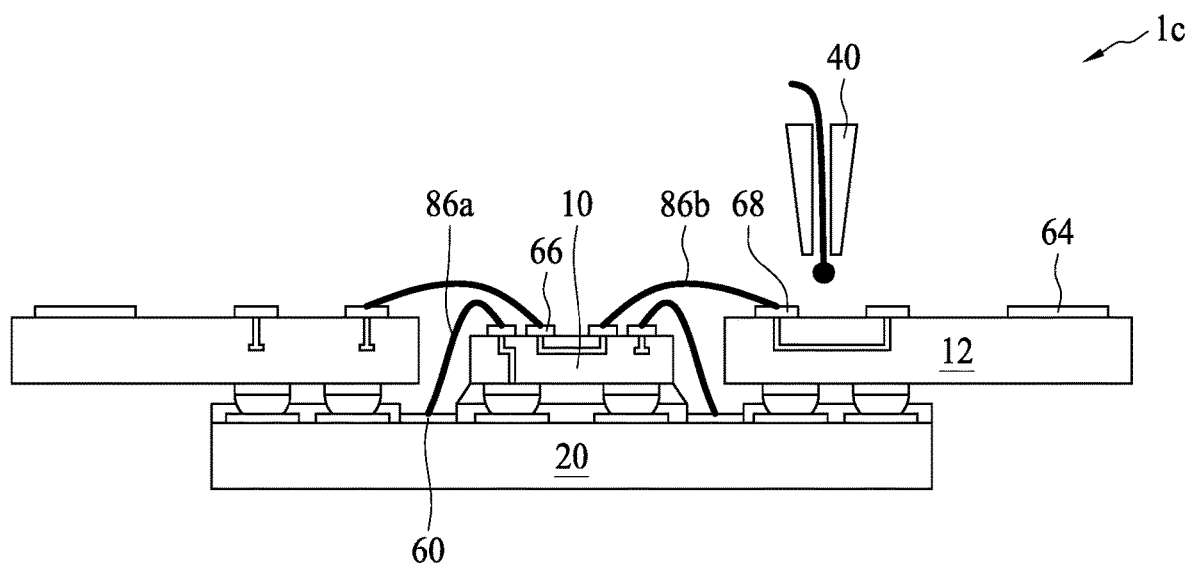

Referring to FIG. 5B, the bonding wire 86b electrically connects the substrate 10 to the substrate 12. In one or more embodiments, the bonding wire 86b may be connected to the substrate 10 through the electrical contact 66 and the bonding wire 86b may be connected to the substrate 12 through the electrical contact 68. The substrate 12 is attached to the electronic component 20 through the connection of the solder bumps 92 and the electrical contacts 62. In one or more embodiments, the solder bumps 92 may be reflowed. After the attaching operation, a combination portion 1c (which can include the portion 1a and the portion 1b) of the semiconductor device package 1 is obtained.

Figure 5C:
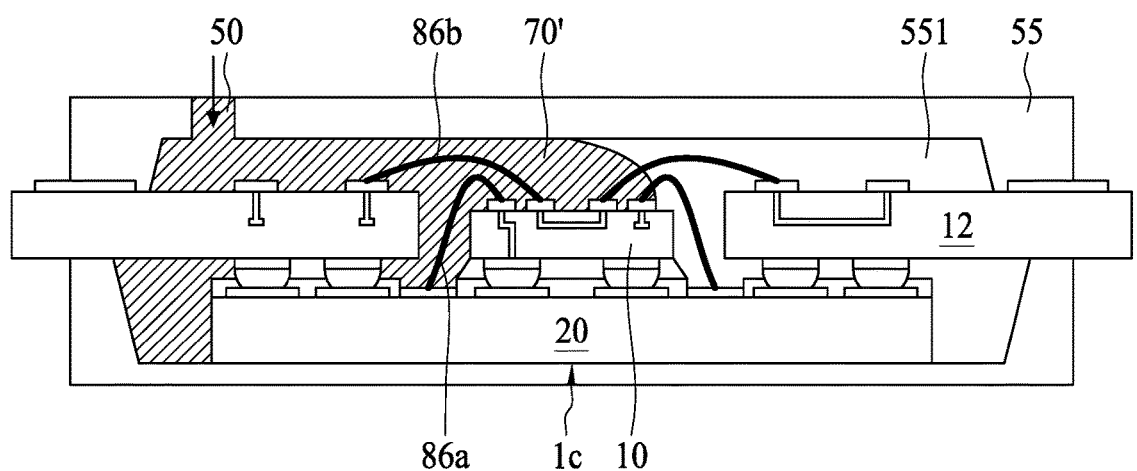

Referring to FIG. 5C, a mold 55 defining a space 551 is provided. The mold 55 defines an opening 50. During the molding operation, a molding compound 70' is heated and melted. The molding compound 70' is filled into the space 551 through the opening 50 and the molding compound 70' surrounds at least a portion of the combination portion 1c. After the space 551 is substantially filled with the melted molding compound 70', the melted molding compound 70' is cured.

Figure 5D:
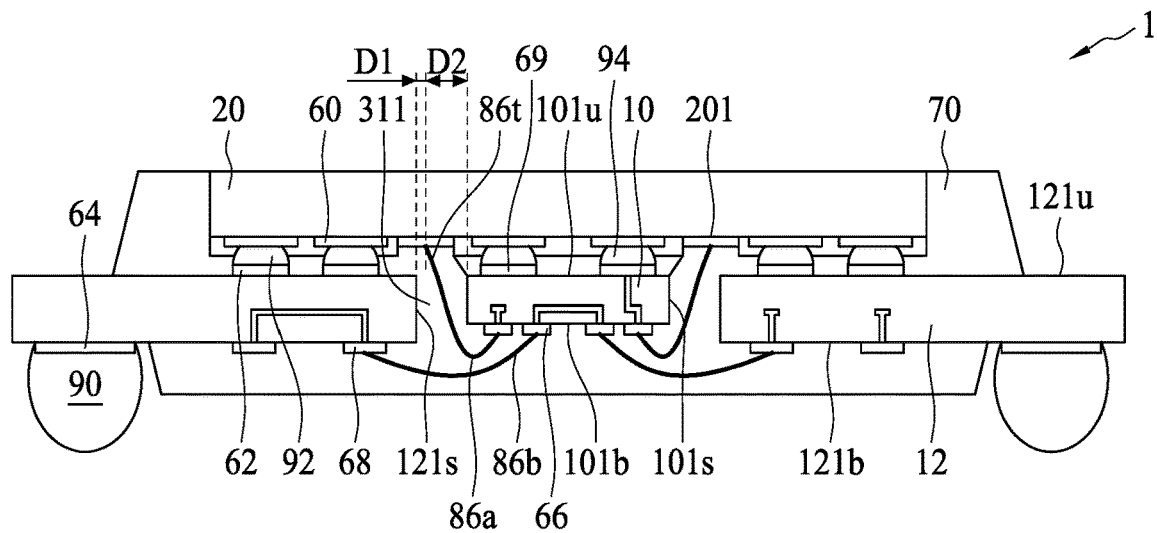

Referring to FIG. 5D, after the molding compound 70' is cured, the package body 70 is formed. The package body 70 encapsulates the substrate 10, the substrate 12, the electronic component 20, the bonding wire 86a and the bonding wire 86b. The solder bumps 90 are disposed on the electrical contacts 64. Next, the semiconductor device package 1 is obtained.

Figure 6:
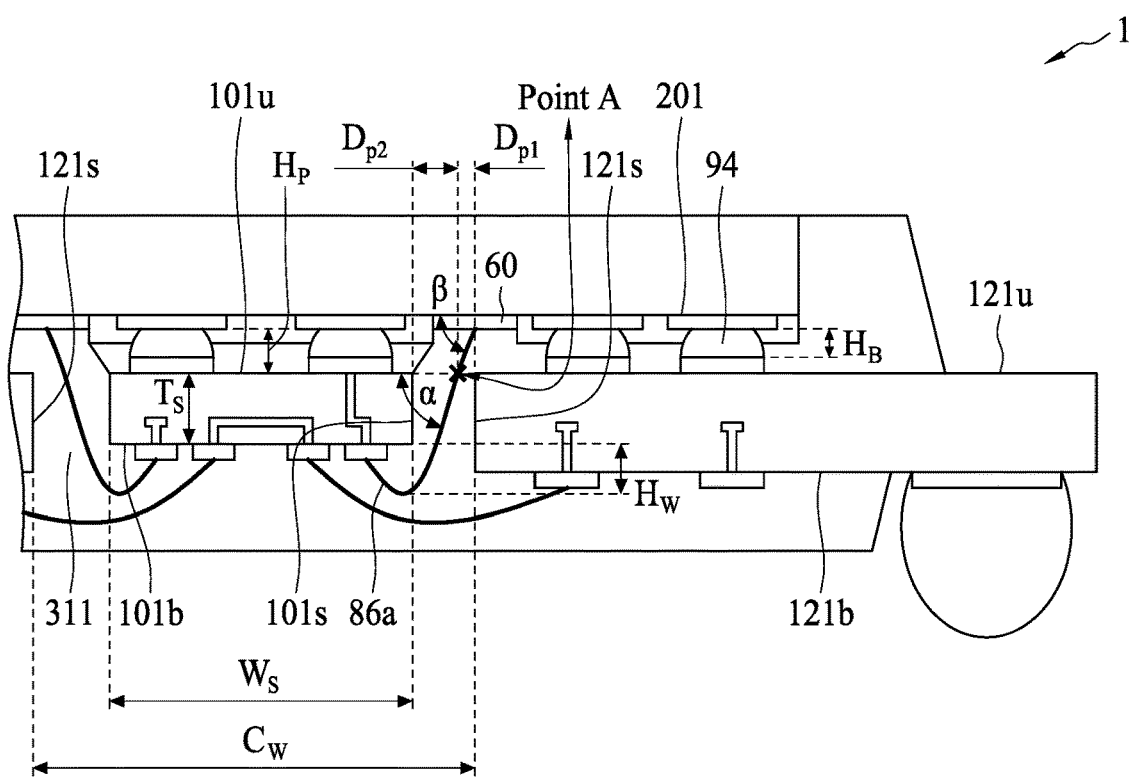
FIG. 6 is a cross-sectional view of a semiconductor device package in accordance with some embodiments of the present disclosure.

FIG. 6 is a cross-sectional view of a semiconductor device package 1 in accordance with some embodiments of the present disclosure. An equation (1) specifying a length $D_{p1}$ is as follow.

$$D_{p1}=H_P/\tan \beta) \le H_B/(\tan \beta) \tag{1}$$

The symbol $D_{p1}$ is a distance between a point A and a lateral surface 121s of the substrate 12. The point A is the cross point of an extended line along the surface 121u (or the surface 101u) and the bonding wire 86a. The symbol $H_P$ is a vertical height of a portion of the bonding wire 86a between the electrical contacts 60 and the point A. In one or more embodiments, if there are no electrical contacts 60, the symbol $H_P$ may be a vertical height of a portion of the bonding wire 86a between the surface 201 and the point A. The symbol $H_B$ is a thickness of the solder bump 94. In one or more embodiments, $H_B$ may be in a range from approximately 20 μm to approximately 40 μm. An angle β is an angle between the electrical contacts 60 and the bonding wire 86a. In one or more embodiments, the angle β may be in a range from approximately 10 degrees to approximately 30 degrees.

An equation (2) for specifying a length $D_{p2}$ is as follow.

$$D_{p2}=(T_S+H_W)/(\tan \alpha) \tag{2}$$

The symbol $D_{p2}$ is a distance between the point A and the lateral surface 101s of the substrate 10. The symbol $T_S$ is a thickness of the substrate 10. In one or more embodiments, the thickness of the substrate 10 may be in a range from approximately 50 μm to approximately 200 μm. The symbol $H_W$ is a vertical height of a portion of the bonding wire 86a between the surface 101b and the highest point of the bonding wire 86a. In one or more embodiments, the length of $H_W$ may be in a range from approximately 5 μm to approximately 50 μm. The angle α is a horizontal angle between the extended line along the surface 121u (or the surface 101u) and the bonding wire 86a. In one or more embodiments, the angle α may be in a range from approximately 60 degrees to approximately 90 degrees.

An equation (3) for specifying a length $C_W$ is as follow.

$$C_W=W_S+2(D_{p1}+D_{p2}) \tag{3}$$

The symbol $C_W$ is a distance between the left surface 121s and the right surface 121s. In one or more embodiments, the $C_W$ may be a longest width of the opening 311. The symbol $W_S$ is a width of the substrate 10. In one or more embodiments, the width of the substrate 10 may be in a range from approximately 5 μm to approximately 10 μm. A length of $D_{p1}+D_{p2}$ is a distance between the surface 121s and the surface 101s.

Figure 7A:
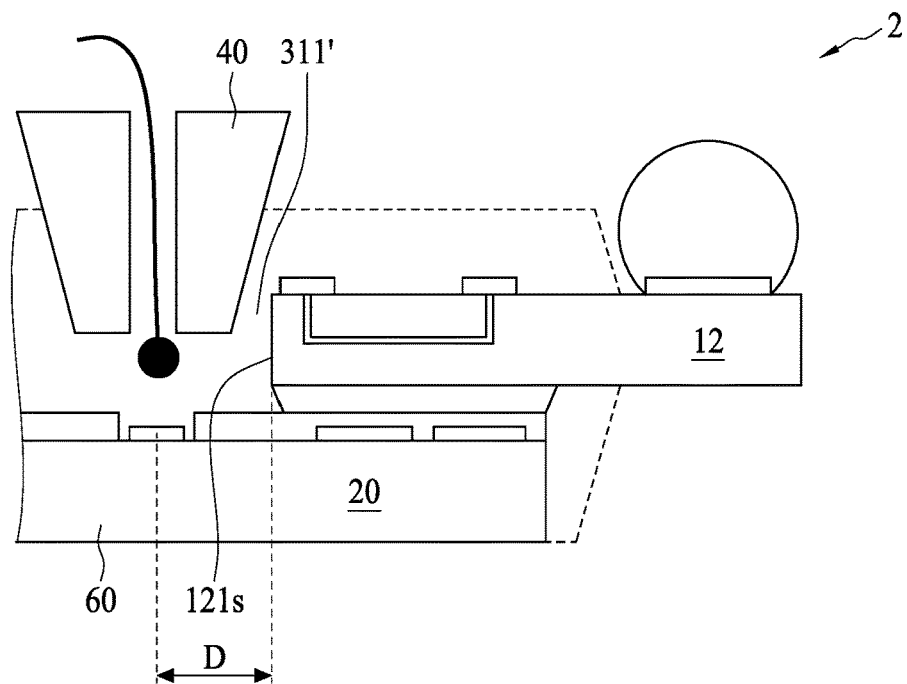
FIG. 7A illustrates another operation for manufacturing bonding wires of the semiconductor device package in accordance with some embodiments of the present disclosure.

FIG. 7A illustrates another operation for manufacturing bonding wires 86c for a semiconductor device package 2 in accordance with some embodiments. In FIG. 7A, a distance D is a size/width of the opening 311' to accommodate operation of a nozzle/capillary 40. The distance D between the lateral surface 121s and a straight line passing through a center an electrical contact 60 and perpendicular to a top surface of the electrical contact 60 is in a range from approximately 896.2 μm to approximately 6,876.2 μm.

Figure 7B:
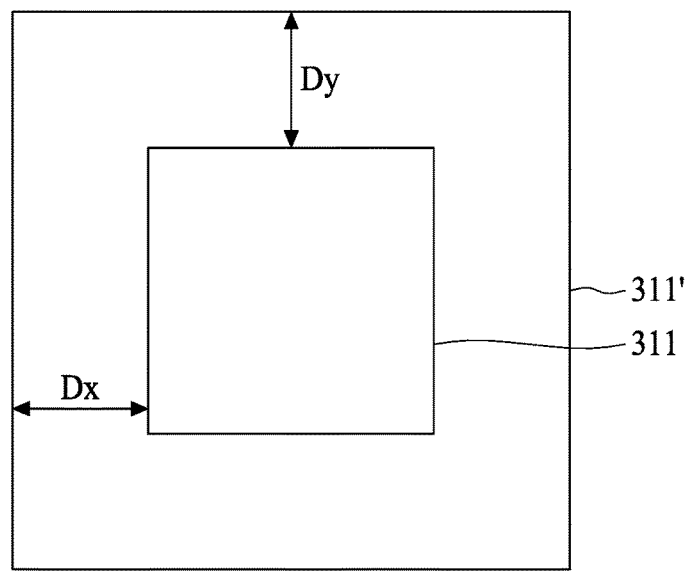
FIG. 7B illustrates a schematic top view of two openings in accordance with some embodiments of the present disclosure.

FIG. 7B illustrates a schematic top view of two openings 311 and 311' in accordance with some embodiments, shown relative to each other. In one or more embodiments, a difference in one dimension of the opening 311 of the semiconductor device package 1 and a corresponding dimension of the opening 311' of the semiconductor device package 2 may be $D_y$, and a difference in another dimension of the opening 311 of the semiconductor device package 1 and a corresponding other dimension of the opening 311' of the semiconductor device package 2 is $D_x$. The opening 311' of the semiconductor device package 2 may be great enough to accommodate the operation of the nozzle/capillary 40. The opening 311' of the semiconductor device package 2 is greater than the opening 311 of the semiconductor device package 1. In one or more embodiments, the difference $D_x$ between the opening 311 and opening 311' along the x-axis is in a range from approximately 6806.7 μm to approximately 602.2 μm. In one or more embodiments, the difference $D_y$ between the opening 311 and opening 311' along the y-axis is in a range from approximately 6806.7 μm to approximately 602.2 μm. The width/size of the opening 311 may be in a range from approximately 6806.7 μm to approximately 602.2 μm.

Figure 8:
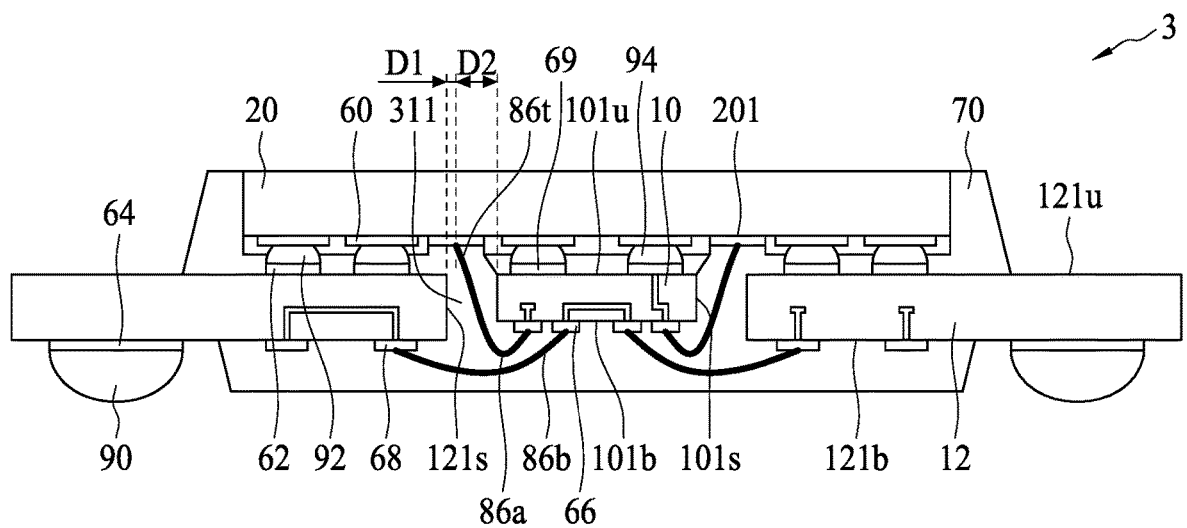
FIG. 8 is a cross-sectional view of a semiconductor device package in accordance with some embodiments of the present disclosure.

FIG. 8 is a cross-sectional view of a semiconductor device package 3 in accordance with some embodiments of the present disclosure. The semiconductor device package 3 shown in FIG. 8 is similar to the semiconductor device package 1 shown in FIG. 1A, and redundant description of same-numbered components may be omitted from the following description. The semiconductor device package 3 includes a substrate 10, a substrate 12, an electronic component 20, electrical contacts 60, 62, 64, 66, 68 and 69, a package body 70, bonding wires 86a and 86b and solder bumps 90, 92 and 94. As compared to the semiconductor device package 1, the solder bumps 90 of the semiconductor device package 3 are thinner than the solder bumps 90 of the semiconductor device package 1 (e.g. may be approximately 0.95 as thick as the solder bumps 90 of the semiconductor package 1, may be approximately 0.90 as thick as the solder bumps 90 of the semiconductor package 1, or may be approximately 0.85 as thick as the solder bumps 90 of the semiconductor package 1). The semiconductor device package 3 may be applied to, for example, a land grid array (LGA) product.

Figure 9:
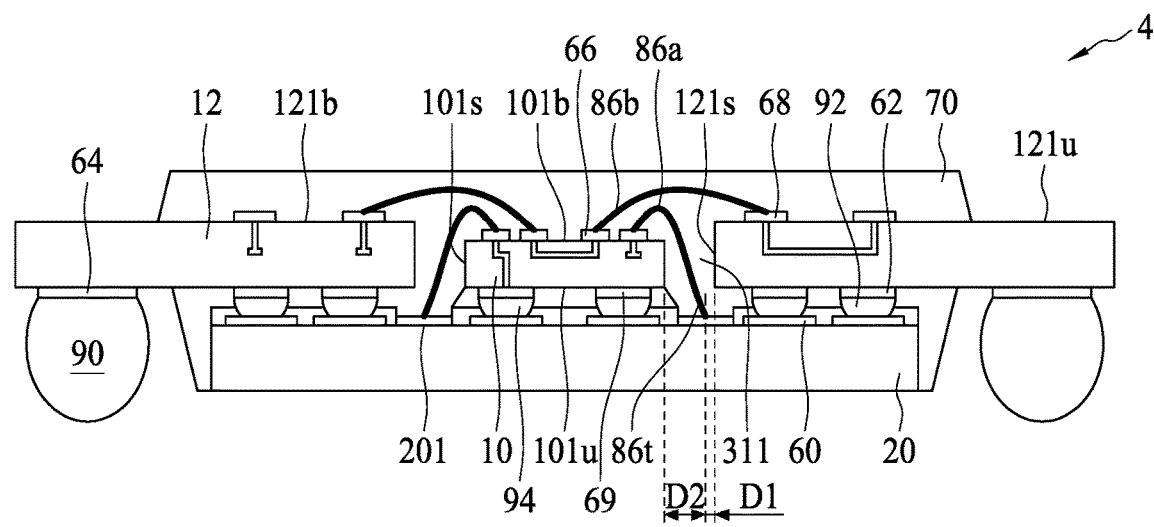
FIG. 9 is a cross-sectional view of a semiconductor device package in accordance with some embodiments of the present disclosure.

FIG. 9 is a cross-sectional view of a semiconductor device package 4 in accordance with some embodiments of the present disclosure. The semiconductor device package 4 shown in FIG. 9 is similar to the semiconductor device package 1 shown in FIG. 1A, and redundant description of same-numbered components may be omitted from the following description. The semiconductor device package 4 includes a substrate 10, a substrate 12, an electronic component 20, electrical contacts 60, 62, 64, 66, 68 and 69, a package body 70, bonding wires 86a and 86b and solder bumps 90, 92 and 94. The electronic component 20 and the solder bumps 90 are disposed on a same side of the substrate 12.

Figure 10A:
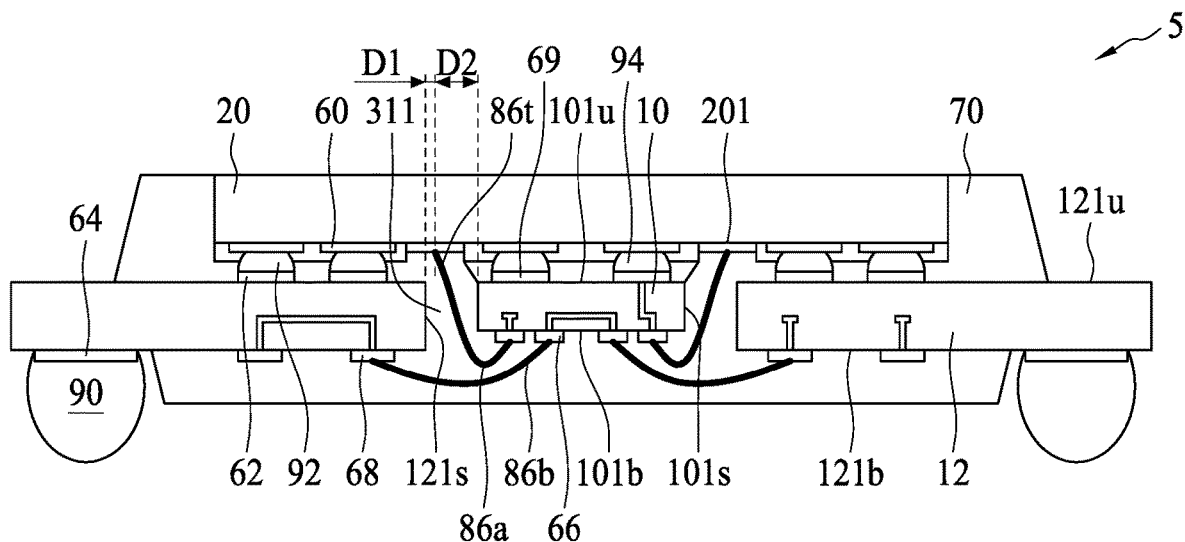
FIG. 10A, FIG. 10B, and FIG. 10C are cross-sectional views of semiconductor device packages in accordance with some embodiments of the present disclosure.
Figure 10B:
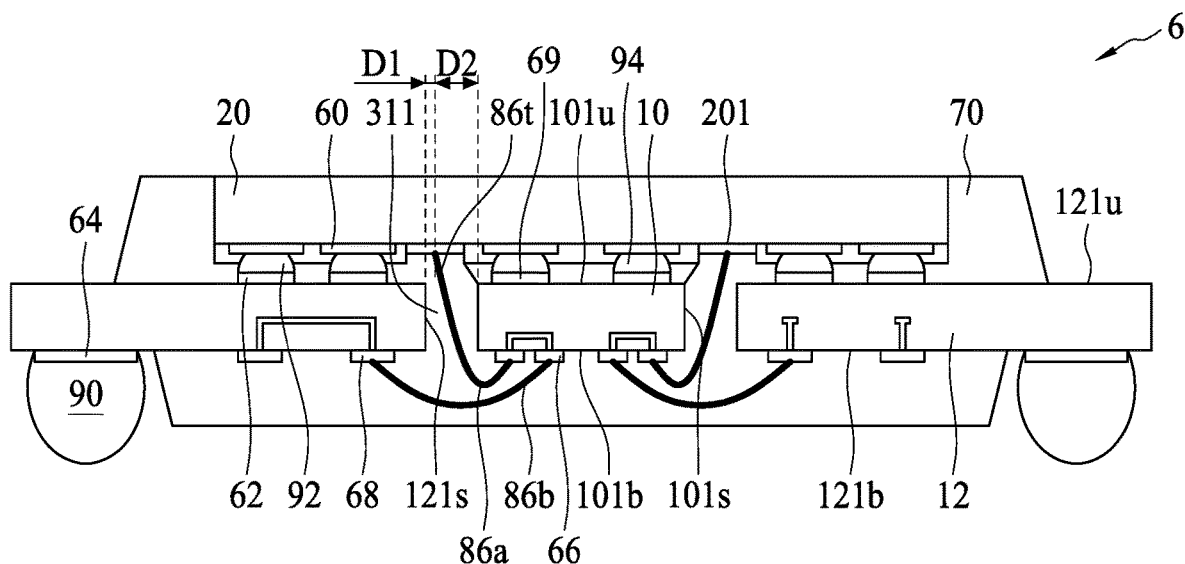
Figure 10C:
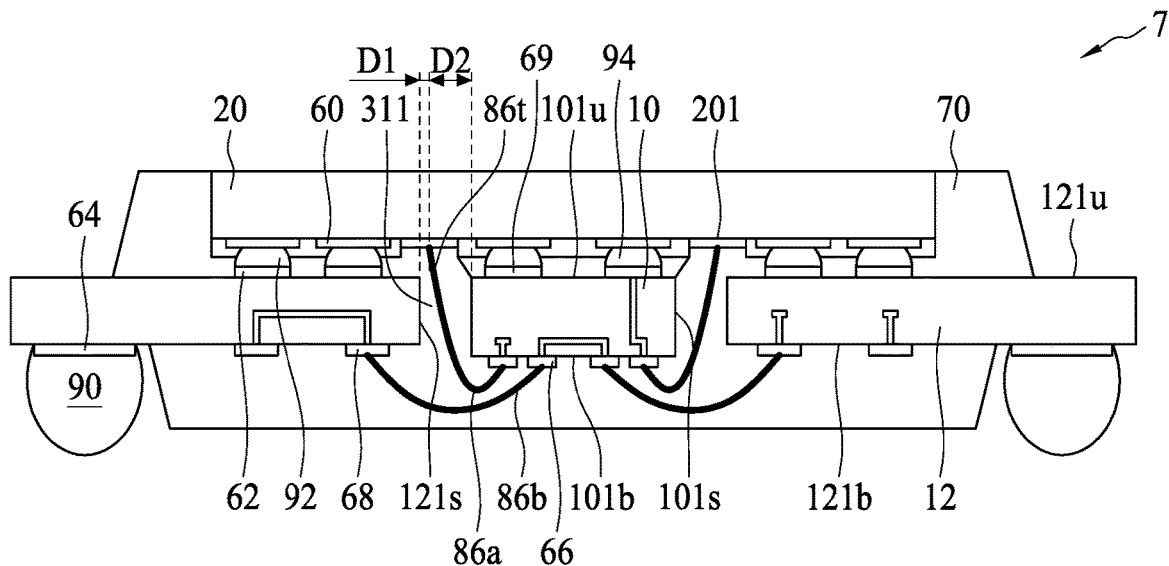

FIG. 10A through FIG. 10C are cross-sectional views of semiconductor device packages 5-7 in accordance with some embodiments of the present disclosure. The semiconductor device packages 5-7 shown in FIGS. 10A through 10C are similar to the semiconductor device package 1 shown in FIG. 1A, and redundant description of same-numbered components may be omitted from the following description. The semiconductor device packages 5-7 include a substrate 10, a substrate 12, an electronic component 20, electrical contacts 60, 62, 64, 66, 68 and 69, a package body 70, bonding wires 86a and 86b and solder bumps 90, 92 and 94. Referring to FIG. 10A, a thickness of the substrate 10 is less than a thickness of the substrate 12 (e.g. is approximately 0.95 or less times the thickness of the substrate 12, is approximately 0.90 or less times the thickness of the substrate 12, or is approximately 0.85 or less times the thickness of the substrate 12). Referring to FIG. 10B, the thickness of the substrate 10 and the substrate 12 is approximately the same. Referring to FIG. 10C, the thickness of the substrate 10 is greater than the thickness of the substrate 12 (e.g. is approximately 1.05 or more times the thickness of the substrate 12, is approximately 1.10 or more times the thickness of the substrate 12, or is approximately 1.15 or more times the thickness of the substrate 12).

Figure 11A:
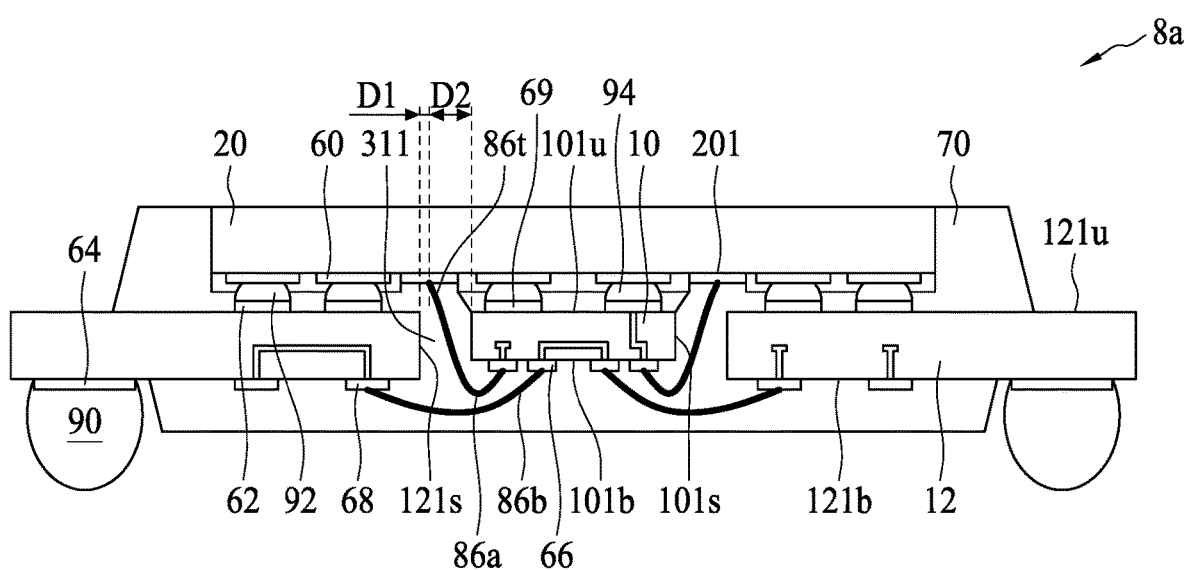
FIG. 11A, FIG. 11B, and FIG. 11C are cross-sectional views of semiconductor device packages in accordance with some embodiments of the present disclosure.
Figure 11B:
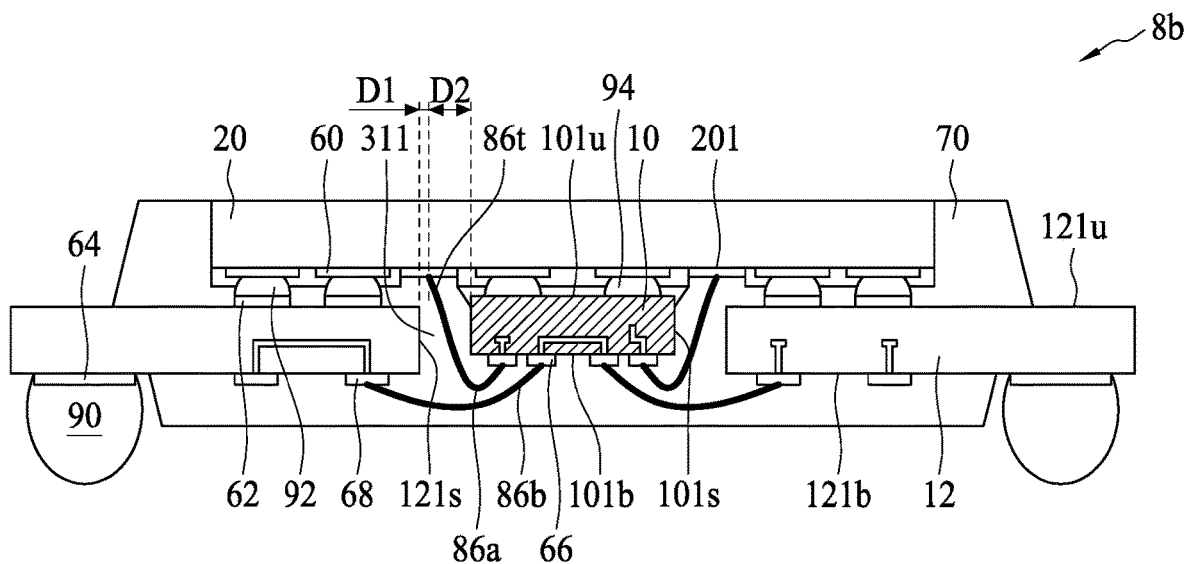
Figure 11C:
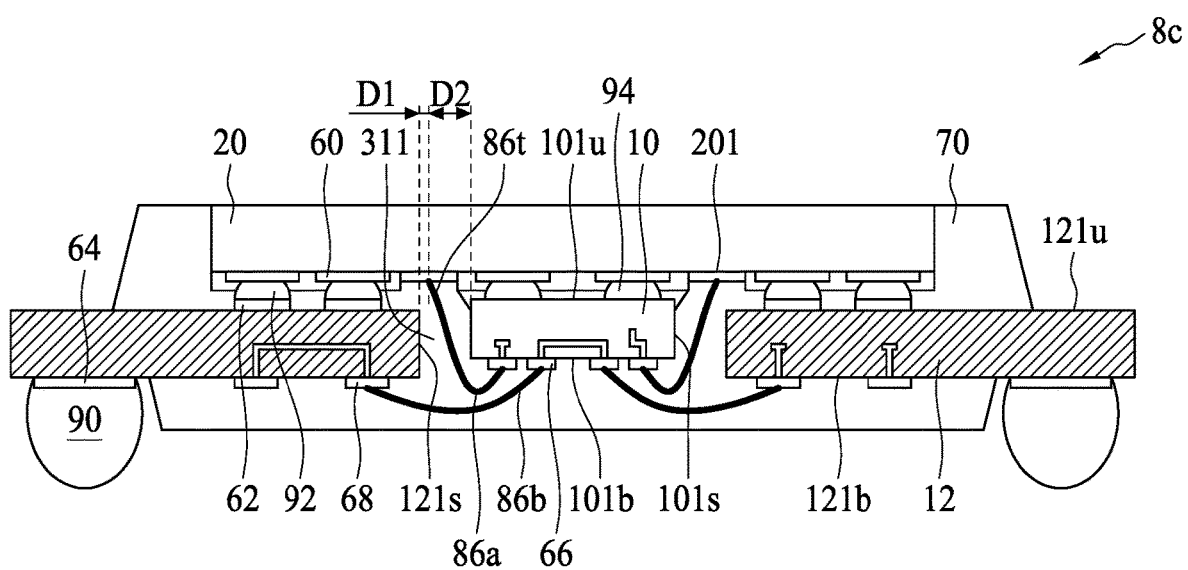

FIG. 11A through FIG. 11C are cross-sectional views of semiconductor device packages 8a-8c in accordance with some embodiments of the present disclosure. The semiconductor device packages 8a-8c shown in FIGS. 11A through 11C are similar to the semiconductor device package 1 shown in FIG. 1A, and redundant description of same-numbered components may be omitted from the following description. The semiconductor device packages 8a-8c include a substrate 10, a substrate 12, an electronic component 20, electrical contacts 60, 62, 64, 66, 68 and 69, a package body 70, bonding wires 86a and 86b and solder bumps 90, 92 and 94. Referring to FIG. 11A, the line width/line space (L/S) densities of the substrate 10 and the substrate 12 are the same. Referring to FIG. 11B, the L/S density of the substrate 10 is higher than the L/S density of the substrate 12. The circuit pitch in the substrate 10 is less than the circuit pitch in the substrate 12 (e.g. is about 0.95 or less times that of the circuit pitch of the substrate 12, is about 0.90 or less times that of the circuit pitch of the substrate 12, or is about 0.85 or less times that of the circuit pitch of the substrate 12). Referring to FIG. 11C, the L/S density of the substrate 10 is less than the L/S density of the substrate 12. The circuit pitch in the substrate 10 is greater than the circuit pitch in the substrate 12 (e.g. is about 1.05 or more times that of the circuit pitch of the substrate 12, is about 1.1 or more times that of the circuit pitch of the substrate 12, or is about 1.15 or more times that of the circuit pitch of the substrate 12).

Figure 12:
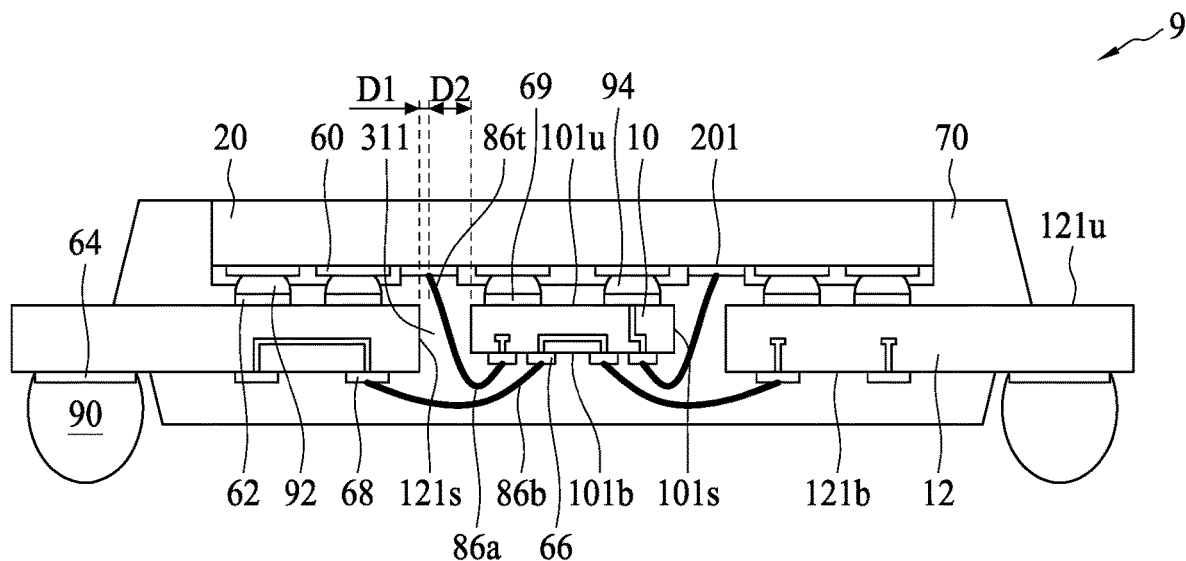
FIG. 12 is a cross-sectional view of a semiconductor device package in accordance with some embodiments of the present disclosure.

FIG. 12 is a cross-sectional view of a semiconductor device package 9 in accordance with some embodiments of the present disclosure. The semiconductor device package 9 shown in FIG. 12 is similar to the semiconductor device package 1 shown in FIG. 1A, and redundant description of same-numbered components may be omitted from the following description. The semiconductor device package 9 includes a substrate 10, a substrate 12, an electronic component 20, electrical contacts 60, 62, 64, 66, 68 and 69, a package body 70, bonding wires 86a and 86b and solder bumps 90, 92 and 94. The substrate 10 is attached to the electronic component 20 by using a molded underfill (MUF) operation. The substrate 10 is attached to the electronic component 20 through the connection of the solder bumps 94 and the exposed electrical contacts 60 without an adhesive layer.

Figure 13:
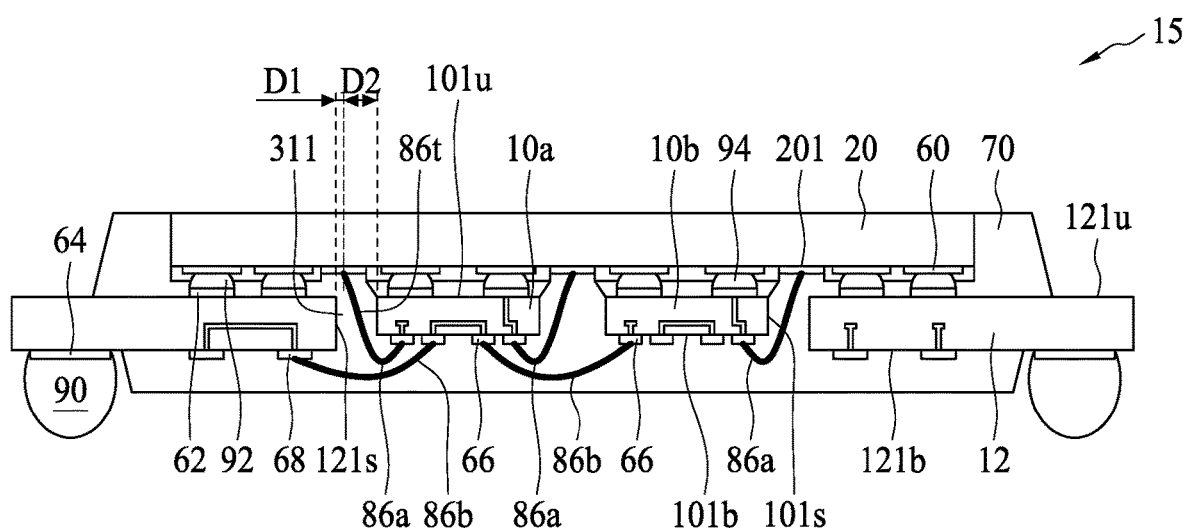
FIG. 13 is a cross-sectional view of a semiconductor device package in accordance with some embodiments of the present disclosure.

FIG. 13 is a cross-sectional view of a semiconductor device package 15 in accordance with some embodiments of the present disclosure. The semiconductor device package 15 shown in FIG. 13 is similar to the semiconductor device package 1 shown in FIG. 1A, and redundant description of same-numbered components may be omitted from the following description. The semiconductor device package 15 includes an electronic component 20, substrates 10a, 10b and 12, electrical contacts 60, 62, 64, 66, 68 and 69, a package body 70, bonding wires 86a and 86b and solder bumps 90, 92 and 94. The bonding wire 86b electrically connects the substrate 10a to the substrate 12. In one or more embodiments, the bonding wire 86b electrically connects the substrate 10a to the substrate 10b. In one or more embodiments, the bonding wire 86a may be connected to the electronic component 20 through the electrical contact 60 and the bonding wire 86a may be connected to the substrate 10a through the electrical contact 66.

Figure 14A:
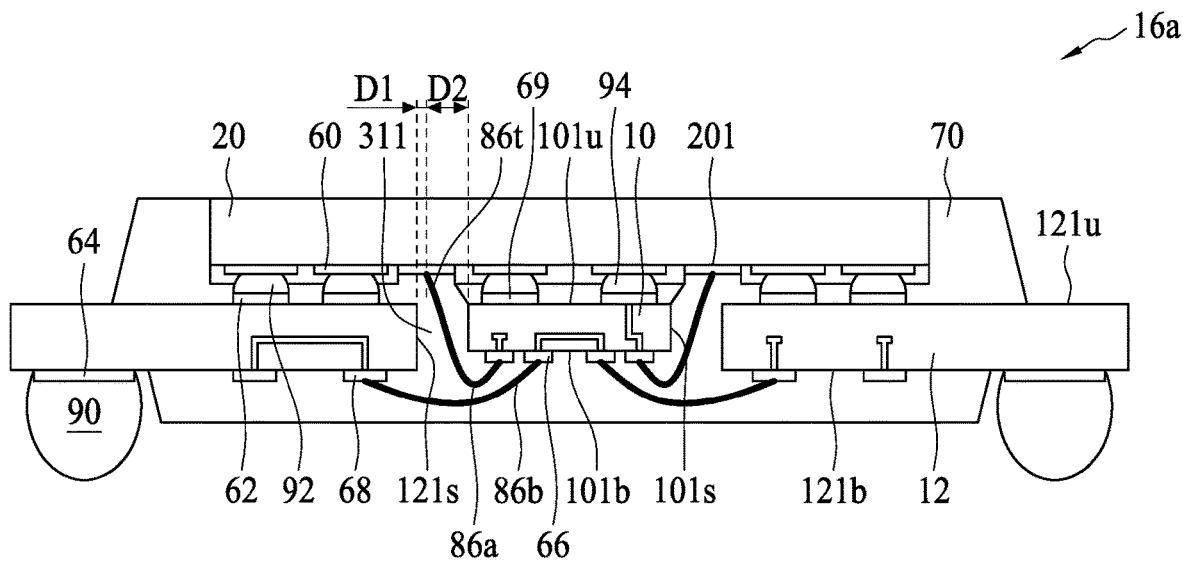
FIG. 14A and FIG. 14B are cross-sectional views of semiconductor device packages in accordance with some embodiments of the present disclosure.
Figure 14B:
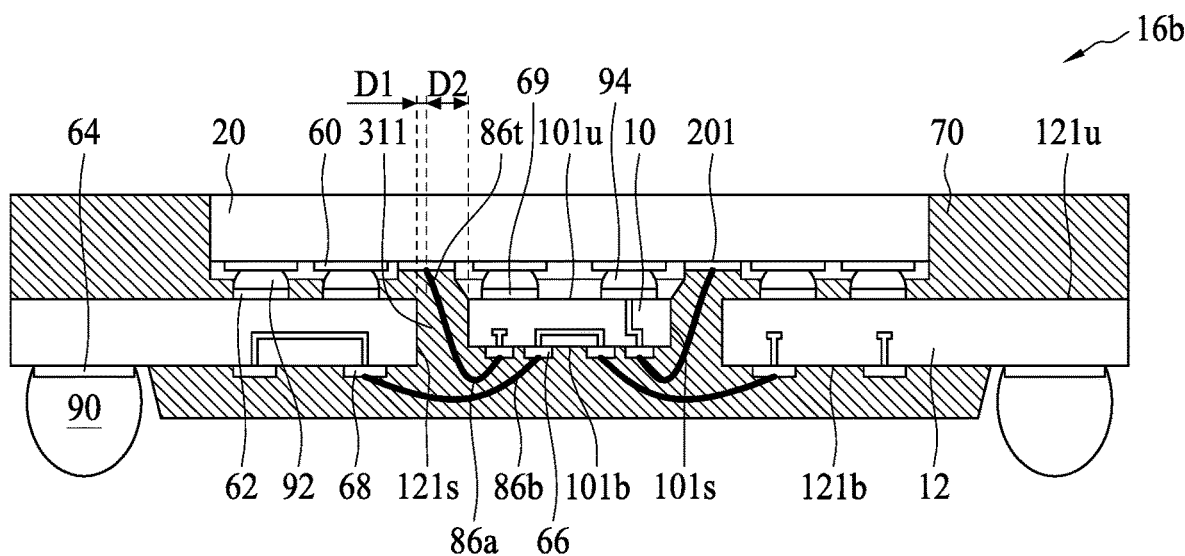

FIG. 14A and FIG. 14B are cross-sectional views of semiconductor device packages 16a and 16b in accordance with some embodiments of the present disclosure. The semiconductor device packages 16a and 16b shown in FIGS. 14A and 14B are similar to the semiconductor device package 1 shown in FIG. 1A, and redundant description of same-numbered components may be omitted from the following description. The semiconductor device packages 16a and 16b include a substrate 10, a substrate 12, an electronic component 20, electrical contacts 60, 62, 64, 66, 68 and 69, a package body 70, bonding wires 86a and 86b and solder bumps 90, 92 and 94. Referring to FIG. 14A, the package body 70 is formed by pressing solid compounds, such as molding. Referring to FIG. 14B, the package body 70 is formed by laminating, such as attaching dry films. In one or more embodiments, the package body 70 may be formed by a filling operation, such as potting or coating encapsulating materials, for example, BT, an ABF, a PP, a PI, an epoxy, or other suitable materials.

Figure 15:
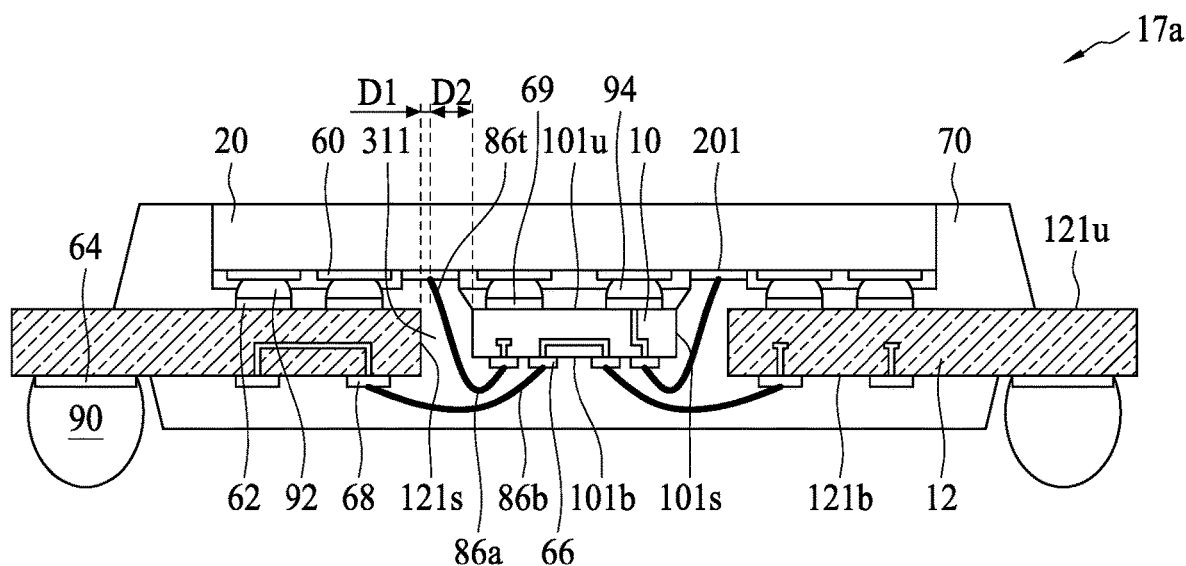
FIG. 15 and FIG. 16 are cross-sectional views of semiconductor device packages in accordance with some embodiments of the present disclosure.
Figure 16:
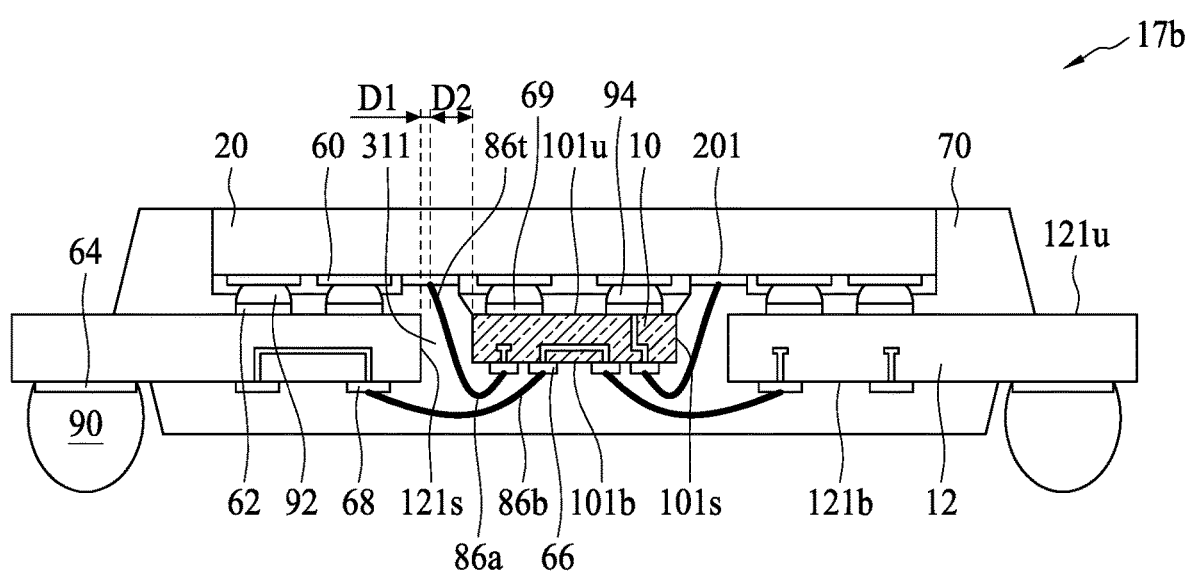

FIG. 15 and FIG. 16 are cross-sectional views of semiconductor device packages 17a and 17b in accordance with some embodiments of the present disclosure. The semiconductor device packages 17a and 17b shown in FIGS. 15 and 16 are similar to the semiconductor device package 1 shown in FIG. 1A, and redundant description of same-numbered components may be omitted from the following description. The semiconductor device packages 17a and 17b include a substrate 10, a substrate 12, an electronic component 20, electrical contacts 60, 62, 64, 66, 68 and 69, a package body 70, bonding wires 86a and 86b and solder bumps 90, 92 and 94. Referring to FIG. 15, the substrate 12 includes an inorganic material. In one or more embodiments, the material of the substrate 12 may include, for example, Si, a ceramic, a glass, a metal or other suitable inorganic materials. The substrate 10 includes an organic material. In one or more embodiments, the material of the substrate 10 may include, for example, BT, an ABF, a PP, a PI, an epoxy, or other suitable organic materials. Referring to FIG. 16, the substrate 10 includes an inorganic material. The material of the substrate 10 may include, for example, Si, a ceramic, a glass, a metal or other suitable inorganic materials. The substrate 12 includes an organic material. In one or more embodiments, the material of the substrate 12 may include, for example, BT, an ABF, a PP, a PI, an epoxy, or other suitable organic materials.

Figure 17A:
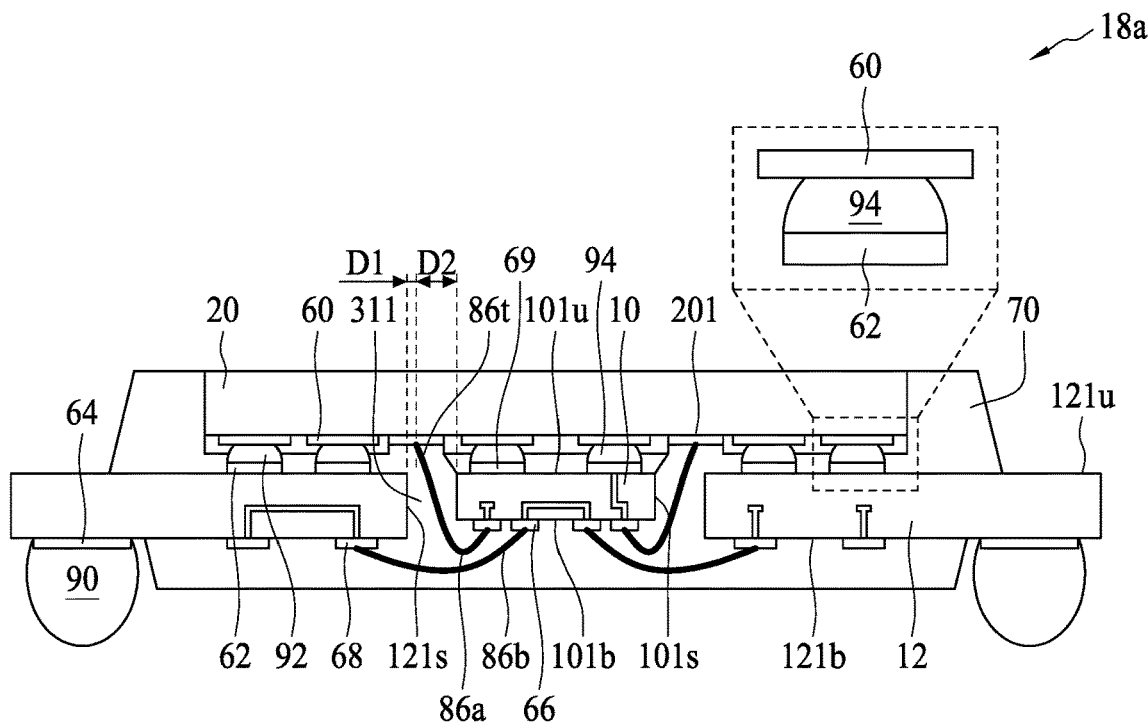
FIG. 17A and FIG. 17B are cross-sectional views of semiconductor device packages in accordance with some embodiments of the present disclosure.
Figure 17B:
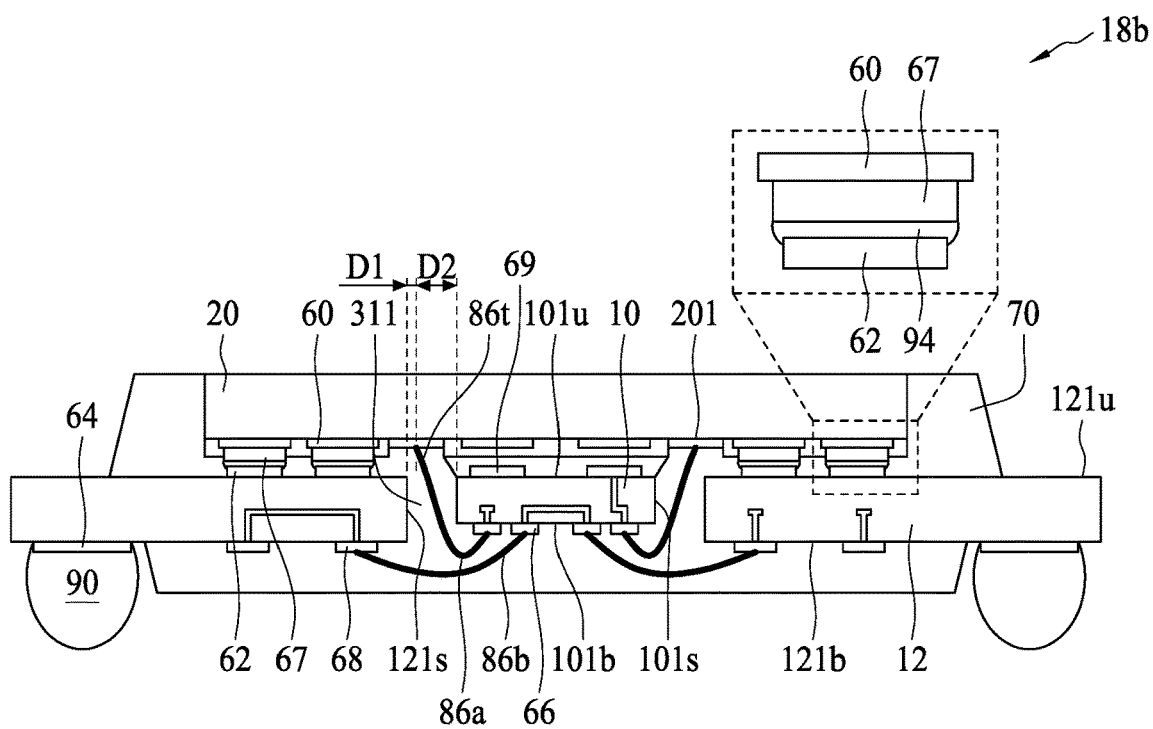

FIG. 17A and FIG. 17B are cross-sectional views of semiconductor device packages 18a and 18b in accordance with some embodiments of the present disclosure. The semiconductor device packages 18a and 18b shown in FIGS. 17A and 17B are similar to the semiconductor device package 1 shown in FIG. 1A, and redundant description of same-numbered components may be omitted from the following description. Referring to FIG. 17A, the semiconductor device package 18a include a substrate 10, a substrate 12, an electronic component 20, electrical contacts 60, 62, 64, 66, 68 and 69, a package body 70, bonding wires 86a and 86b and solder bumps 90, 92 and 94. The solder bumps 94 are conductive bumps. The solder bumps 94 electrically connected to the electrical contacts 60 and 62.

Referring to FIG. 17B, the semiconductor device package 18b include a substrate 10, a substrate 12, an electronic component 20, electrical contacts 60, 62, 64, 66, 68 and 69, conductive pillar 67, a package body 70, bonding wires 86a and 86b and solder bumps 90, 92 and 94. The solder bumps 94 are thinner conductive bumps than the solder bumps 94 shown in FIG. 17A. The solder bumps 94 are electrically connected to the electrical contacts 62 and the conductive pillar 67. In one or more embodiments, a material of the conductive pillar 67 may include, for example, Cu, another metal or metal alloy, or other suitable conductive materials. The conductive pillar 67 is electrically connected to the electrical contact 60.

Figure 18:
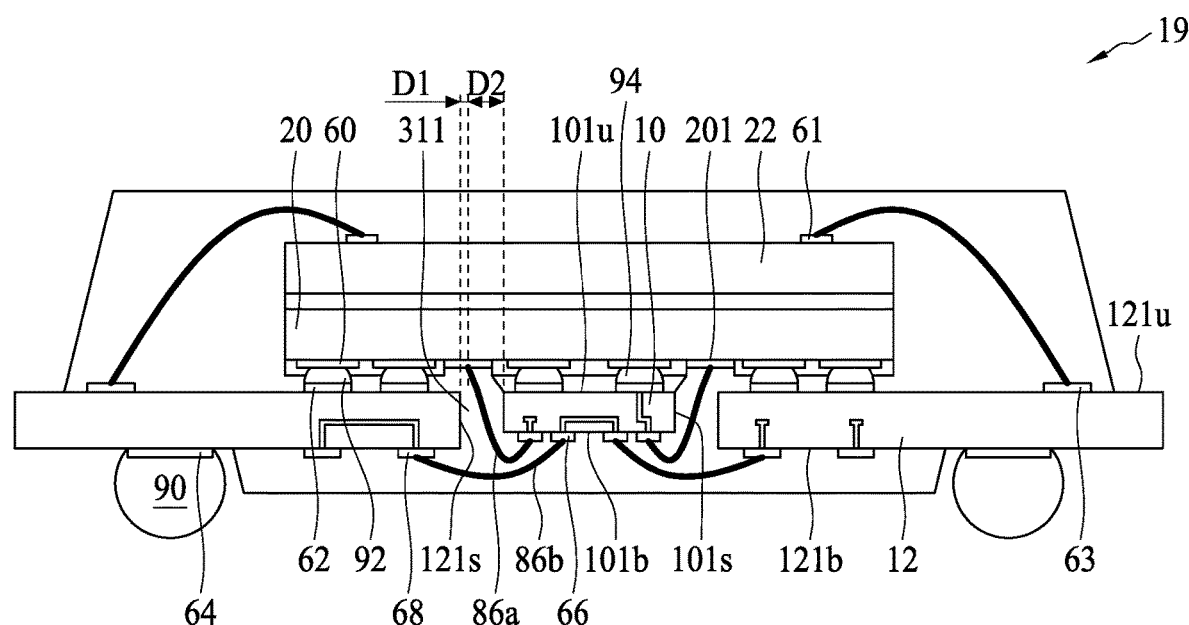
FIG. 18 is a cross-sectional view of a semiconductor device package in accordance with some embodiments of the present disclosure.

FIG. 18 is a cross-sectional view of a semiconductor device package 19 in accordance with some embodiments of the present disclosure. The semiconductor device package 19 shown in FIG. 18 is similar to the semiconductor device package 1 shown in FIG. 1A, and redundant description of same-numbered components may be omitted from the following description. The semiconductor device package 19 includes a substrate 10, a substrate 12, electronic components 20 and 22, electrical contacts 60, 62, 64, 66, 68 and 69, a package body 70, bonding wires 86a and 86b and solder bumps 90, 92 and 94. The stacked electronic components 20 and 22 are disposed from back side to back side (e.g. with active surfaces facing away from each other). The electronic component 22 is electrically connected to the substrate 12 through the electrical contacts 61.

Figure 19A:
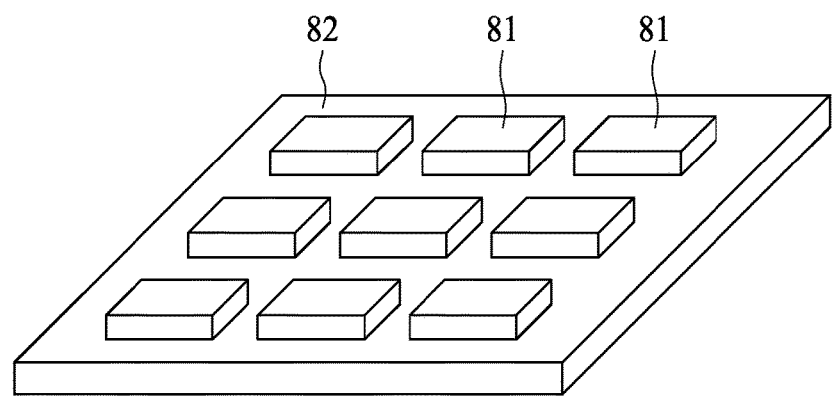
FIG. 19A and FIG. 19B illustrate different types of semiconductor package devices in accordance with some embodiments of the present disclosure.
Figure 19B:
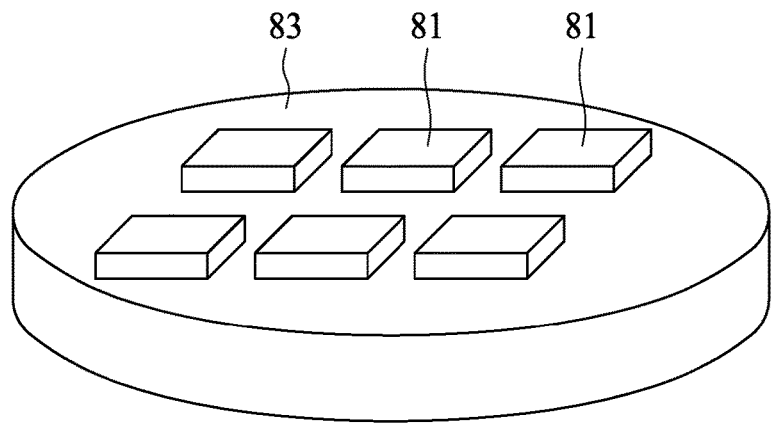

FIG. 19A and FIG. 19B illustrate different types of semiconductor package devices in accordance with some embodiments of the present disclosure.

As shown in FIG. 19A, a plurality of chips 81 or dies are placed on a substantially square-shaped carrier 82 (e.g. in accordance with one or more embodiments described herein). In some embodiments, the carrier 82 may include organic materials (e.g., a molding compound, BT, a PI, polybenzoxazole (PBO), a solder resist, an ABF, a PP or an epoxy based material) and/or inorganic materials (e.g., silicon, a glass, a ceramic or quartz).

As shown in FIG. 19B, a plurality of chips 81 or dies are placed on a substantially circle-shaped carrier 83 (e.g. in accordance with one or more embodiments described herein). In some embodiments, the carrier 83 may include organic materials (e.g., a molding compound, BT, a PI, PBO, a solder resist, an ABF, a PP or an epoxy based material) and/or inorganic materials (e.g., silicon, a glass, a ceramic or quartz).

Figure 20:
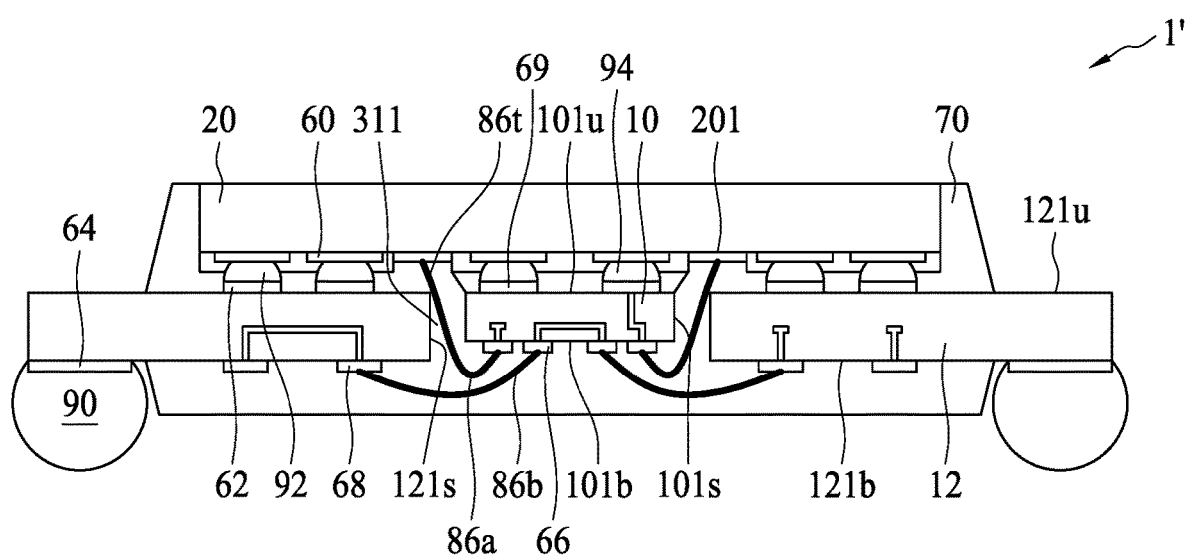
FIG. 20 is a cross-sectional view of a semiconductor device package in accordance with some embodiments of the present disclosure.

FIG. 20 is a cross-sectional view of a semiconductor device package 1' in accordance with some embodiments of the present disclosure. The semiconductor device package 1' is similar to the semiconductor device package 1 of FIG. 1A, and redundant description of same-numbered components may be omitted from the description of FIG. 20. The semiconductor device package 1' includes a substrate 10, a substrate 12, an electronic component 20, electrical contacts 60, 62, 64, 66, 68 and 69, a package body 70, bonding wires 86a and 86b and solder bumps 90, 92 and 94. A portion of the bonding wire 86 is covered by the substrate 12. Disposing a portion of the bonding wire 86 between the substrate 12 and the electronic component 20 may reduce a width of the opening 311 of the semiconductor device package 1'. A width of the opening 311 of the semiconductor device package 1' may thus be less than a width of the opening 311 of the semiconductor device package 1. A lateral size (along the horizontal direction in the orientation shown in FIG. 20) of the semiconductor device package 1' may thus be reduced.

Figure 21:
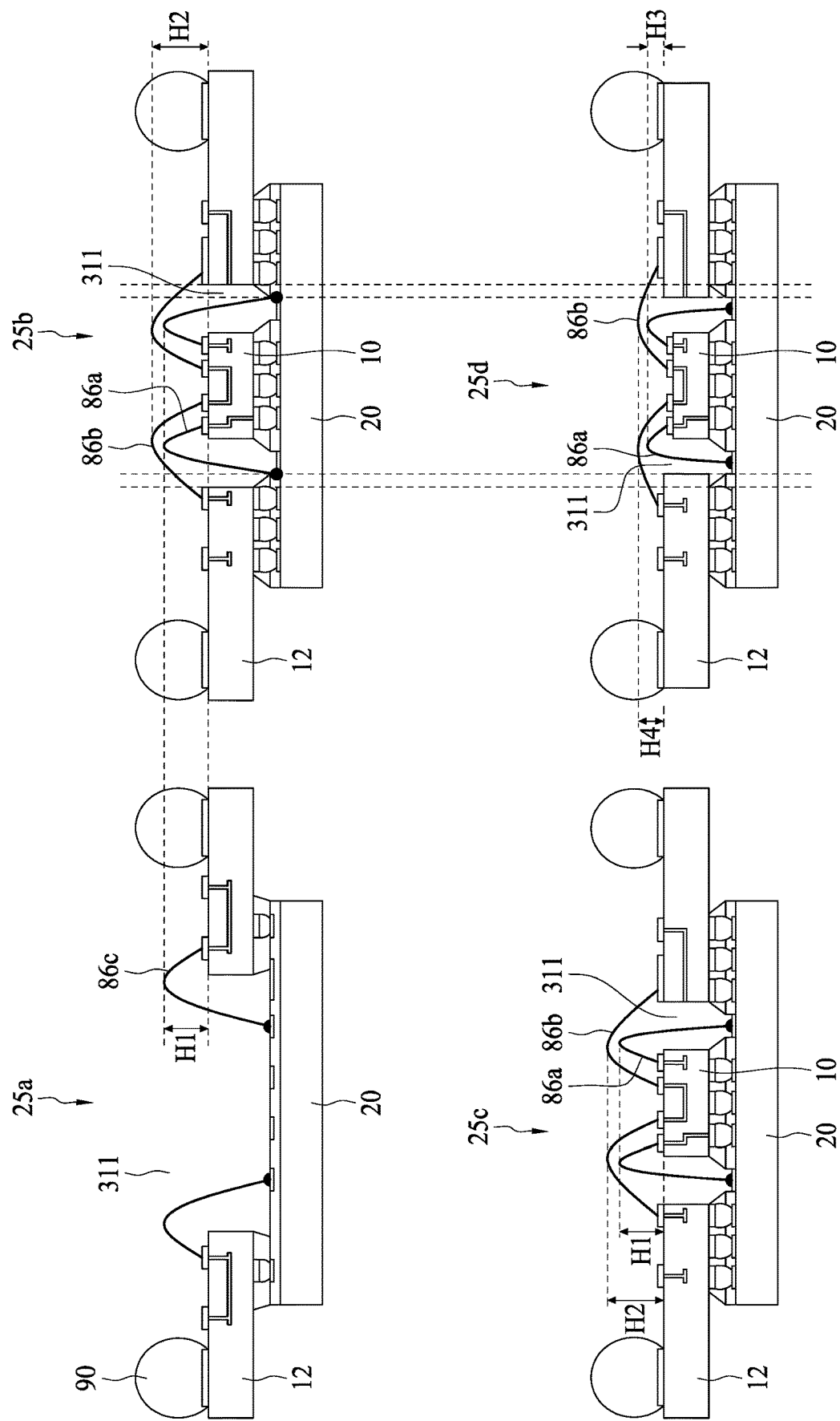
FIG. 21 is a schematic diagram of a cross-sectional view of semiconductor device packages in accordance with some embodiments of the present disclosure.

FIG. 21 is a schematic diagram of a cross-sectional view of semiconductor device packages 25a-25d in accordance with some embodiments of the present disclosure. The semiconductor device packages 25a-25d are similar to the semiconductor device package 1 of FIG. 1A, and redundant description of same-numbered components may be omitted from the description of FIG. 21. There is no substrate 10 in the opening 311 of the semiconductor device packages 25a. For the semiconductor device packages 25a, a symbol H1 is a vertical height of a portion of the bonding wire 86c between a surface of the substrate 12 and the highest point of the bonding wire 86c. For the semiconductor device packages 25b-25d, a symbol H1 is a vertical height of a portion of the bonding wire 86a between a surface of the substrate 12 and the highest point of the bonding wire 86a. A symbol H2 is a vertical height of a portion of the bonding wire 86b between a surface of the substrate 12 (or substrate 10) and a highest point of the bonding wire 86b.

The semiconductor device package 25a omits the substrate 10. Therefore, a width of the opening 311 of the semiconductor device package 25a may be larger than a width of the opening 311 of the semiconductor device package 25c, since an operation for disposing the bonding wires 86c (to replace the substrate 10) may benefit from a greater operation space to use a nozzle/capillary to form the bonding wires 86c.

A width of the opening 311 of the semiconductor device package 25d may be less than a width of the opening 311 of the semiconductor device package 25b, since a thickness of the substrate 10 of the semiconductor device package 25d is less than a thickness of the substrate 12 of the semiconductor device package 25d. A height H3 for the semiconductor device package 25d (corresponding to a vertical position of highest portion of the bonding wire 86a relative to the electronic component 20) is less than a corresponding height H1 for the semiconductor device package 25b and a height H4 for the semiconductor device package 25d (corresponding to a vertical position of highest portion of the bonding wire 86b relative to the electronic component 20) is less than a corresponding height H2 for the semiconductor device package 25b. A height of the solder bumps 90 may be reduced due to the low heights H3 and H4. The lower height of the solder bumps 90 may be advantageous for the subsequent operation (such as bonding to a PCB board). The lower heights H3 and H4 may be advantageous for reducing the thickness of the semiconductor device package 25d.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be substantially, approximately, or about the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be substantially aligned or coplanar if a displacement between the two surfaces is no greater than 0.5 μm, no greater than 1 μm, no greater than 5 μm, no greater than 10 μm, or no greater than 15 μm. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
    an electronic component having a first surface;
    a first substrate disposed on the first surface of the electronic component;
    a first bonding wire electrically connecting the first substrate to the electronic component;
    a second substrate disposed on the first surface of the electronic component, the second substrate defining an opening accommodating the first substrate and the first bonding wire;
    a second bonding wire electrically connecting the first substrate to the second substrate; and
    a conductive bump disposed on the first surface of the electronic component, wherein the conductive bump electrically connects the first substrate to the electronic component.

2. The semiconductor device package of claim 1,
    wherein the first bonding wire comprises a terminal connected to the electronic component;
    wherein the first substrate has a lateral surface, the second substrate has a lateral surface facing the lateral surface of the first substrate; and
    wherein a distance from the terminal to the lateral surface of the second substrate is smaller than a distance from the terminal to the lateral surface of the first substrate.

3. The semiconductor device package of claim 2, wherein the terminal and a portion of the first bonding wire are disposed between the electronic component and the second substrate.

4. The semiconductor device package of claim 2, wherein a portion of the first bonding wire is disposed between the lateral surface of the first substrate and lateral surface of the second substrate.

5. The semiconductor device package of claim 1, wherein a thickness of the first substrate is different from a thickness of the second substrate.

6. The semiconductor device package of claim 1, wherein a thickness of the first substrate is less than a thickness of the second substrate.

7. The semiconductor device package of claim 1, wherein a lower surface of the first substrate and a lower surface of the second substrate are not coplanar.

8. The semiconductor device package of claim 1, further comprising a package body encapsulating the first substrate, the second substrate, the electronic component, the first bonding wire and the second bonding wire.

9. The semiconductor device package of claim 1, further comprising at least one electrical contact disposed on the second substrate.

10. The semiconductor device package of claim 1, wherein a portion of the first bonding wire passes through the opening of the second substrate.

11. The semiconductor device package of claim 1, wherein a portion of the first bonding wire passes through the second substrate.

12. A semiconductor device package, comprising:
an electronic component having a first surface;
a first substrate disposed on the first surface of the electronic component;
a first bonding wire electrically connecting the first substrate to the electronic component;
a second substrate disposed on the first surface of the electronic component, the second substrate surrounding the first substrate and being separated from the first substrate;
a second bonding wire electrically connecting the first substrate to the second substrate; and
a conductive bump disposed on the first surface of the electronic component, wherein the conductive bump electrically connects the first substrate to the electronic component.

13. The semiconductor device package of claim 12,
wherein the first bonding wire comprises a terminal connecting to the electronic component;
wherein the first substrate has a lateral surface, the second substrate has a lateral surface facing the lateral surface of the first substrate; and
wherein a distance from the terminal to the lateral surface of the second substrate is less than a distance from the terminal to the lateral surface of the first substrate.

14. The semiconductor device package of claim 13, wherein the terminal and a portion of the first bonding wire are disposed between the electronic component and the second substrate.

15. The semiconductor device package of claim 12, wherein the second substrate has a lower surface connected to the second bonding wire, and the first substrate has a lower surface that is not coplanar with the lower surface of the second substrate.

16. The semiconductor device package of claim 15, wherein a distance between the lower surface of the first substrate and the first surface of the electronic component is less than a distance between the lower surface of the second substrate and the first surface of the electronic component.

17. The semiconductor device package of claim 12, further comprising a package body encapsulating the first substrate, the second substrate, the electronic component, the first bonding wire and the second bonding wire.

18. The semiconductor device package of claim 12, further comprising at least one electrical contact disposed on the second substrate.

19. The semiconductor device package of claim 12, wherein a portion of the first bonding wire passes through the second substrate.

20. A method of manufacturing a semiconductor device package, comprising:
providing an electronic component, a first substrate comprising conductive bumps and a second substrate;
disposing the first substrate on the electronic component;
bonding a first wire to electrically connect the first substrate to the electronic component, such that the conductive bumps electrically connect the first substrate to the electronic component;
disposing the electronic component on the second substrate; and
bonding a second wire to electrically connect the second substrate to the first substrate.

21. The method of claim 20, wherein disposing the electronic component on the second substrate comprises inserting the first substrate into an opening defined by the second substrate.

22. The method of claim 20, wherein disposing the electronic component on the second substrate comprises covering a portion of the first wire so that the portion of the first wire is disposed between the electronic component and the second substrate.

23. The method of claim 20, further comprising passing the first wire through the second substrate.

* * * * *